(12) United States Patent
Nakamura

(10) Patent No.: US 8,674,915 B2
(45) Date of Patent: Mar. 18, 2014

(54) LIQUID CRYSTAL DISPLAY APPARATUS

(75) Inventor: Yayoi Nakamura, Hino (JP)

(73) Assignee: Casio Computer Co., Ltd., Tokyo (JP)

( * ) Notice: Subject to any disclaimer, the term of this patent is extended or adjusted under 35 U.S.C. 154(b) by 375 days.

(21) Appl. No.: 13/045,557

(22) Filed: Mar. 11, 2011

(65) Prior Publication Data

US 2011/0227816 A1    Sep. 22, 2011

(30) Foreign Application Priority Data

Mar. 19, 2010   (JP) ................................. 2010-064865

(51) Int. Cl.
*G09G 3/36*    (2006.01)

(52) U.S. Cl.
USPC ................................. 345/87; 345/90; 345/92

(58) Field of Classification Search
USPC .......................................... 345/87–100, 204
See application file for complete search history.

(56) References Cited

U.S. PATENT DOCUMENTS

| | | | |
|---|---|---|---|
| 6,873,377 B2 | 3/2005 | Konno et al. | |
| 7,064,803 B2 | 6/2006 | Okazaki et al. | |
| 2009/0244419 A1 | 10/2009 | Nakamura et al. | |
| 2010/0007810 A1 | 1/2010 | Nakamura | |

FOREIGN PATENT DOCUMENTS

| | | | |
|---|---|---|---|
| JP | 7-152013 A | 6/1995 | |
| JP | 11-212053 A | 8/1999 | |
| JP | 2001-166321 A | 6/2001 | |
| JP | 2003-084299 A | 3/2003 | |
| JP | 2004-271631 A | 9/2004 | |
| JP | 2008-102306 A | 5/2008 | |
| JP | 2009-244818 A | 10/2009 | |

OTHER PUBLICATIONS

Japanese Office Action dated Apr. 10, 2012 (and English translation thereof) in counterpart Japanese Application No. 2010-064865.

*Primary Examiner* — Regina Liang
(74) *Attorney, Agent, or Firm* — Holtz, Holtz, Goodman & Chick

(57) ABSTRACT

A liquid crystal display apparatus includes an auxiliary electrode between adjacent first and second scan signal lines, first and second thin film transistors with gate electrodes connected to the first and second scan signal lines, respectively, first and second pixel electrodes connected to one of a source electrode and a drain electrode of the first and second thin film transistors, respectively, a data signal line that is connected to the other of the source electrode and the drain electrode of the first and second thin film transistors, and a common electrode facing the pixel electrodes via a liquid crystal layer. The first and second pixel electrodes are adjacent along the data signal line. A potential difference between the auxiliary and common electrodes is greater than a potential difference between the first pixel electrode and the common electrode and a potential difference between the second pixel electrode and the common electrode.

20 Claims, 18 Drawing Sheets

LIQUID CRYSTAL DISPLAY APPARATUS

CROSS-REFERENCE TO RELATED APPLICATIONS

This application is based upon and claims the benefit of priority from prior Japanese Patent Application No. 2010-064865, filed Mar. 19, 2010, the entire contents of which are incorporated herein by reference.

BACKGROUND OF THE INVENTION

1. Field of the Invention
This invention relates to a liquid crystal display apparatus.
2. Description of the Related Art A wider viewing angle is desired in a liquid crystal display apparatus. It is thus considered that pixels are divided into first and second two regions and that voltages applied to liquid crystal in the first region and the second region have different values. As a result, the two regions have different viewing angle characteristics, and a wide viewing angle is obtained by the synergy of these viewing angle characteristics.

In a liquid crystal display apparatus of this kind described in, for example, Jpn. Pat. Appln. KOKAI Publication No. 7-152013, a first pixel electrode connected to a first thin film transistor and a second pixel electrode connected to a second thin film transistor are formed in each pixel.

In this liquid crystal display apparatus, both the first thin film transistor and the second thin film transistor are connected to the same data signal line and scan signal line. The scan signal line is laid to extend between the first pixel electrode and the second pixel electrode.

Furthermore, in this liquid crystal display apparatus, the charge capability of the first thin film transistor is different from the charge capability of the second thin film transistor so that voltages having different values are applied to liquid crystal in the first region and liquid crystal in the second region.

Meanwhile, in the conventional liquid crystal display apparatus, when a voltage is applied across the first pixel electrode as well as the second pixel electrode and a common electrode, liquid crystal molecules located in the vicinity of the side of the second pixel electrode or the first pixel electrode in the adjacent pixel are tilted in a direction different from a pretilt direction determined by the direction of rubbing treatment of an alignment film, and cause disclination.

Although this disclination is invisible under a light-shielding film (black mask), the part where the disclination is caused is pressed and expanded into the opening of the pixel, and causes abnormal display if a weight is partly applied to a display surface. The conventional liquid crystal display apparatus shows the abnormal display caused by the disclination for a certain period of time even if the weight applied to the display surface is removed.

BRIEF SUMMARY OF THE INVENTION

An object of the invention is to provide a liquid crystal display apparatus, while having a wide viewing angle, capable of eliminating abnormal display caused when a weight is applied to the display surface substantially simultaneously with the removal of the weight.

A liquid crystal display apparatus according to an aspect of the invention includes an auxiliary electrode located between a first scan signal line and a second scan signal line that are adjacent to each other, a first thin film transistor with a gate electrode connected to the first scan signal line, a second thin film transistor with a gate electrode connected to the second scan signal line, a first pixel electrode connected to one of a source electrode and a drain electrode of the first thin film transistor, a second pixel electrode connected to one of a source electrode and a drain electrode of the second thin film transistor, a data signal line that is connected to the other of the source electrode and the drain electrode of the first thin film transistor and that is connected to the other of the source electrode and the drain electrode of the second thin film transistor, and a common electrode disposed to face the first pixel electrode and the second pixel electrode through a liquid crystal layer. The first pixel electrode and the second pixel electrode are adjacently located along the data signal line. The auxiliary electrode is set to a direct-current voltage so that a potential difference between the auxiliary electrode and the common electrode is greater than a potential difference between the first pixel electrode and the common electrode and greater than a potential difference between the second pixel electrode and the common electrode.

A liquid crystal display apparatus according to another aspect of the invention includes an auxiliary electrode located between a first scan signal line and a second scan signal line that are adjacent to each other, a first thin film transistor with a gate electrode connected to the first scan signal line, a second thin film transistor with a gate electrode connected to the second scan signal line, a first pixel electrode connected to one of a source electrode and a drain electrode of the first thin film transistor, a second pixel electrode connected to one of a source electrode and a drain electrode of the second thin film transistor, and a data signal line that is connected to the other of the source electrode and the drain electrode of the first thin film transistor and that is connected to the other of the source electrode and the drain electrode of the second thin film transistor. The first pixel electrode and the second pixel electrode are adjacently located along the data signal line. The auxiliary electrode is located between the first pixel electrode and the second pixel electrode, and is set to a direct-current voltage of a value equal to a gate on voltage or a gate off voltage supplied to the first scan signal line.

A liquid crystal display apparatus according to still another aspect of the invention includes a first pixel and a second pixel adjacently located along a data signal line, and an auxiliary electrode located between the first pixel and the second pixel. The first pixel includes two pixel electrodes connected to a first scan signal line through different thin film transistors. The two pixel electrodes in the first pixel are disposed so that the first scan signal line intervenes therebetween. The second pixel includes two pixel electrodes connected to a second scan signal line through different thin film transistors. The two pixel electrodes in the second pixel are disposed so that the second scan signal line intervenes therebetween. The auxiliary electrode is provided to extend in parallel to the first scan signal line and the second scan signal line. The auxiliary electrode is set to a direct-current voltage of a value equal to a gate on voltage or a gate off voltage supplied to the first scan signal line.

A liquid crystal display apparatus according to further another aspect of the invention includes a first pixel and a second pixel adjacently located along a data signal line, and an auxiliary electrode located between the first pixel and the second pixel. The first pixel includes two pixel electrodes connected to a first scan signal line through different thin film transistors. The two pixel electrodes in the first pixel are disposed so that the first scan signal line intervenes therebetween. The second pixel includes two pixel electrodes connected to a second scan signal line through different thin film transistors. The two pixel electrodes in the second pixel are disposed so that the second scan signal line intervenes therebetween. The auxiliary electrode is provided to extend in parallel to the first scan signal line and the second scan signal line. The auxiliary electrode is set to a direct-current voltage so that a potential difference between the auxiliary electrode and a common electrode is greater than a potential difference between the two pixel electrodes in the first pixel and the common electrode and greater than a potential difference between the two pixel electrodes in the second pixel and the common electrode.

A liquid crystal display apparatus according to the invention can eliminate abnormal display caused when a weight is applied to the display surface substantially simultaneously with the removal of the weight, while it has a wide viewing angle.

Advantages of the invention will be set forth in the description which follows, and in part will be obvious from the description, or may be learned by practice of the invention. The Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
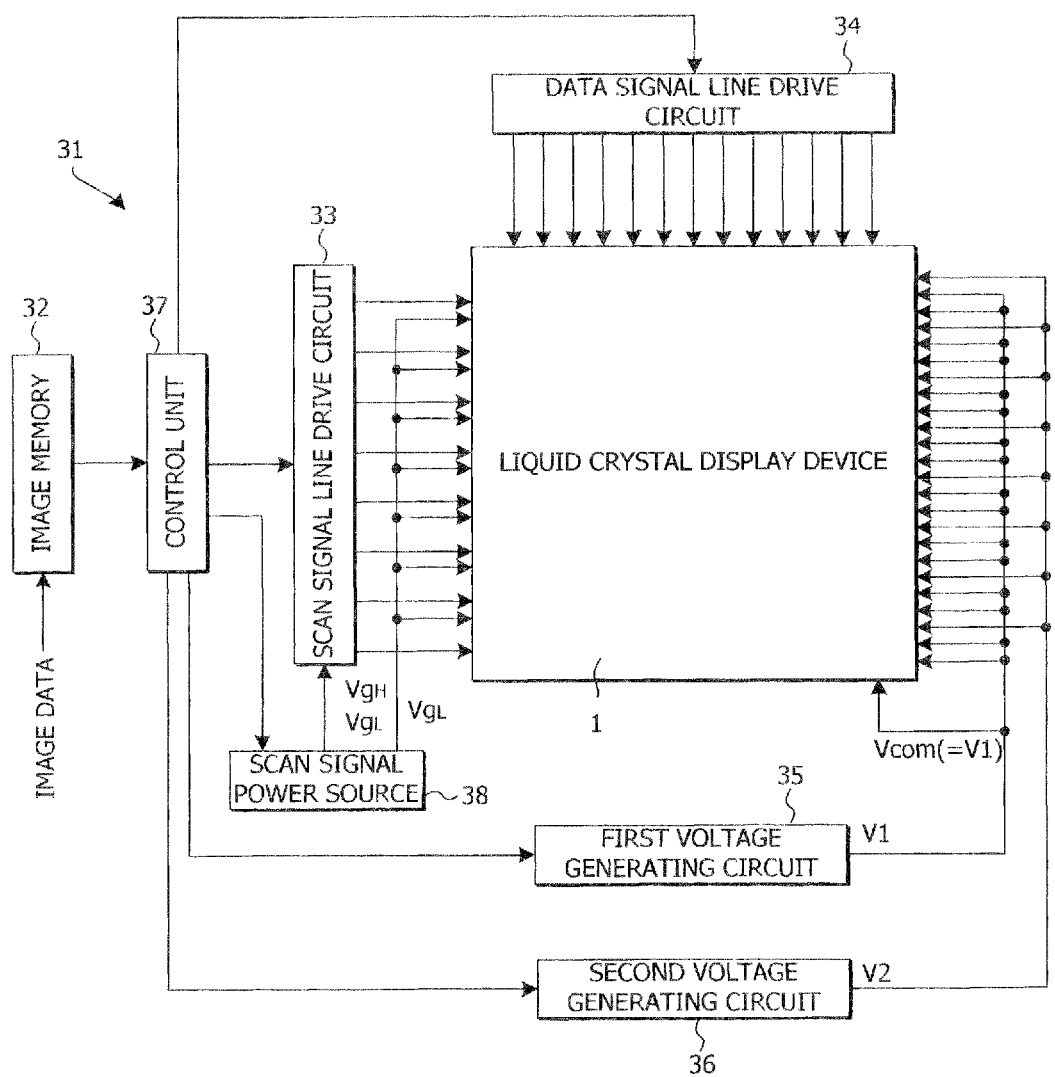
FIG. 1 is a configuration diagram of a liquid crystal display apparatus according to a first embodiment of this invention.

As shown in FIG. 1, a liquid crystal display apparatus according to a first embodiment of this invention comprises a liquid crystal display device 1, and a driving unit 31 for driving the liquid crystal display device 1.

Figure 2:
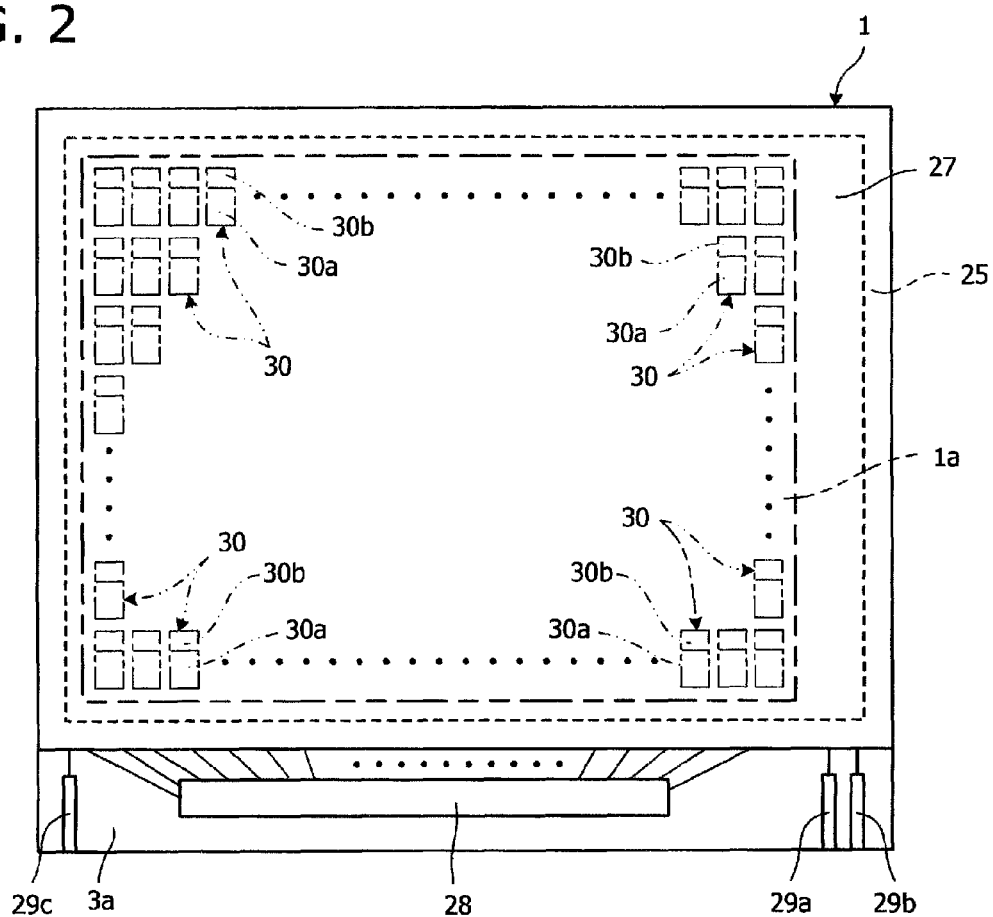
FIG. 2 is a plan view of a liquid crystal display device according to the first embodiment.

The liquid crystal display device 1 is an active matrix liquid crystal display device in which a thin film transistor (hereinafter referred to as a TFT) its used as a switching element. As shown in FIG. 2, pixels 30 are arranged in a row direction (a lateral direction in the diagram) and a column direction (a longitudinal direction in the diagram).

As shown in FIG. 2 to FIG. 10, a transparent first substrate 3 and a transparent second substrate 4 are disposed to face each other in the liquid crystal display device 1. Transparent pixel electrodes 5 are arranged in the row direction and the column direction on the surface of the first substrate (e.g., a substrate opposite to a display surface side) 3 facing the second substrate 4. On the other hand, a single-film transparent common electrode 6 facing the pixel electrodes 5 is provided on the surface of the second substrate 4 facing the first substrate 3. The pixel electrodes 5 and the common electrode are made of, for example, ITO as transparent conducting materials.

Each of the pixel electrodes 5 comprises a first pixel electrode 5a and a second pixel electrode 5b that are separate from each other. In this embodiment, the first pixel electrode 5a and the second pixel electrode 5b have the same lateral width (width in the row direction). The first pixel electrode 5a is in the shape of a longitudinally greater rectangle having a longitudinal width (width in the column direction) which is about double the lateral width. The second pixel electrode 5b is in a substantially square shape in which the longitudinal width and the lateral width are substantially equal.

Furthermore, the first substrate 3 is provided with scan signal lines 7 laid to extend in the row direction for the respective rows of the pixel electrodes 5, and data signal lines 8 laid to extend in the column direction for the respective columns of the pixel electrodes 5.

The scan signal line 7 is disposed to extend between the first pixel electrode 5a and the second pixel electrode 5b that constitute the pixel. The data signal line 8 is disposed to extend in the column direction in a region on one side of the pixel electrodes 5 in each column.

Moreover, a first TFT 9a connected to the first pixel electrode 5a and a second TFT 9b connected to the second pixel electrode 5b are located on the first substrate 3 for each of the pixel electrodes 5. The first TFT 9a and the second TFT 9b are located in the row direction in regions between the first pixel electrode 5a and the second pixel electrode 5b.

As shown in FIG. 4, FIG. 5, FIG. 6, and FIG. 7, each of the first and second TFTs 9a and 9b comprises a gate electrode 10 formed on the first substrate 3, a transparent gate insulating film 11 formed over the gate electrode 10 in substantially the whole region on the first substrate 3, an intrinsic amorphous silicon semiconductor thin film 12 formed on the gate insulating film 11 to face the gate electrode 10, a channel protection film 13 provided in the center of the upper surface of the semiconductor thin film 12, and a source electrode 15 and a drain electrode 16 respectively formed, through n-type amorphous silicon contact layers 14, on one side of a channel region of the semiconductor thin film 12 and the other across this channel region.

The first TFT 9a and the second TFT 9b are in invert shapes. That is, the first TFT 9a is formed so that the drain electrode 16 is provided on a side facing the first pixel electrode 5a and so that the source electrode 15 is provided on the other side. The second TFT 9b is formed so that the drain electrode 16 is provided on a side facing the second pixel electrode 5b and so that the source electrode 15 is provided on the other side. (Here, for convenience of explanation, of the two input/output electrodes of the TFT, the electrode connected to the pixel electrode is referred to as the drain electrode, and the electrode connected to the data signal line is referred to as the source electrode. However, these electrodes may be referred to the other way around.

The gate electrode 10 of the first TFT 9a and the gate electrode 10 of the second TFT 9b are connected to the scan signal line 7 disposed to extend between the first pixel electrode 5a and the second pixel electrode 5b.

Furthermore, the source electrode 15 of the first TFT 9a and the source electrode 15 of the second TFT 9b are connected to the data signal line 8 disposed to extend on one side of the first pixel electrode 5a and the second pixel electrode 5b. The first pixel electrode 5a and the second pixel electrode 5b are adjacently located along the data signal line 8.

Each of the scan signal lines 7 is formed on the first substrate 3 integrally with the gate electrodes 10 by a metal film as a conducting material having the same light shielding properties as the gate electrodes 10 of the first and second TFTs 9a and 9b. That is, a predetermined region of the scan signal line 7 is provided as the gate electrodes 10.

Each of the data signal lines 8 is formed on the gate insulating film 11 by the same metal film as the source and drain electrodes 15 and 16 of the first and second TFTs 9a and 9b.

Branch lines 8a extending toward a region between the first pixel electrode 5a and the second pixel electrode 5b of the pixel electrode 5 in each row are integrally formed in each of the data signal lines 8. Each of the branch lines 8a is curved to pass on the side of the source electrode 15 of the first TFT 9a located closer to the data signal line 8 between the first TFT 9a and the second TFT 9b that are in invert shapes, and to reach the side of the source electrode 15 of the second TFT 9b located far from the data signal line 8. The data signal line 8 is then integrally connected to the source electrode 15 of the first TFT 9a and the source electrode 15 of the second TFT 9b through the branch line 8a.

In this embodiment, the first TFT 9a, the second. TFT 9b, the scan signal line 7, and the data signal line 8 are formed in the process of forming the gate electrode 10 and the scan signal line 7 on the first substrate 3, sequentially forming the gate insulating film 11, the semiconductor thin film 12, and the channel protection film 13 to then pattern the channel protection film 13 into a shape that covers the center of the semiconductor thin film 12, sequentially forming the contact layer 14 and the metal film, and collectively patterning the metal film, the contact layer 14, and the semiconductor thin film 12 into the shapes of the source electrode 15, the drain electrode, and the data signal line 8. Thus, the data signal line 8 is formed on a foundation layer comprising the semiconductor thin film 12 and the contact layer 14 among stacked films that constitute the first TFT 9a and the second TFT 9b.

Furthermore, a transparent coating insulating film 20 is provided on the gate insulating film 11 to cover the TFTs 9a and 9b and the data signal lines 8. On this coating insulating film 20, the first pixel electrode 5a and the second pixel electrode 5b are formed. The first pixel electrode 5a is connected to the drain electrode 16 of the first TFT 9a, and the second pixel electrode 5b is connected to the drain electrode 16 of the second TFT 9b.

The first pixel electrode 5a and the second pixel electrode 5b are formed by piercing first and second contact holes 201 and 202 in parts of the coating insulating film 20 on the drain electrodes 16, 16 of the first TFT 9a and the second TFT 9b, forming an ITO film on the coating insulating film 20, and patterning the ITO film into the shapes of the first and second pixel electrodes 5a and 5b.

Therefore, the first pixel electrode 5a is connected to the drain electrode 16 of the first TFT 9a in the first contact hole 201, and the second pixel electrode 5b is connected to the drain electrode 16 the second TFT 9b in the second contact hole 202.

That is, in the liquid crystal display device 1, the first pixel electrode 5a connected to the first TFT 9a and the second pixel electrode 5b connected to the second TFT 9b are formed for each of the pixels 30, and the first TFT 9a and the second TFT 9b are connected to the same data signal line 8 and scan signal line 7 in this pixel.

Thus, from a part between the first pixel electrode 5a and the second pixel electrode 5b, each of the pixels 30 is divided into a first region 30a in which the first pixel electrode 5a is formed and a second region 30b in which the second pixel electrode 5b is formed.

The first TFT 9a and the second TFT 9b are switched on or off under the control of a scan signal from the same scan signal line 7. The first TFT 9a and the second TFT 9b are switched on at the same time so that a data signal supplied from the same data signal line 8 is applied to the first pixel electrode 5a and the second pixel electrode 5b.

Furthermore, the first substrate 3 is provided with a first capacitive electrode 17 to form a first compensating capacity Cs1 by the intervention of a first dielectric layer between the first capacitive electrode 17 and the first pixel electrode 5a, a second capacitive electrode 18a to form a second compensating capacity Cs2 by the intervention of a second dielectric layer between the second capacitive electrode 18a and the second pixel electrode 5b, and a third capacitive electrode 18b for each of the pixels 30 to form a third compensating capacity Cs3 by the intervention of a third dielectric layer between the third capacitive electrode 18b and the second pixel electrode 5b.

Figure 4:
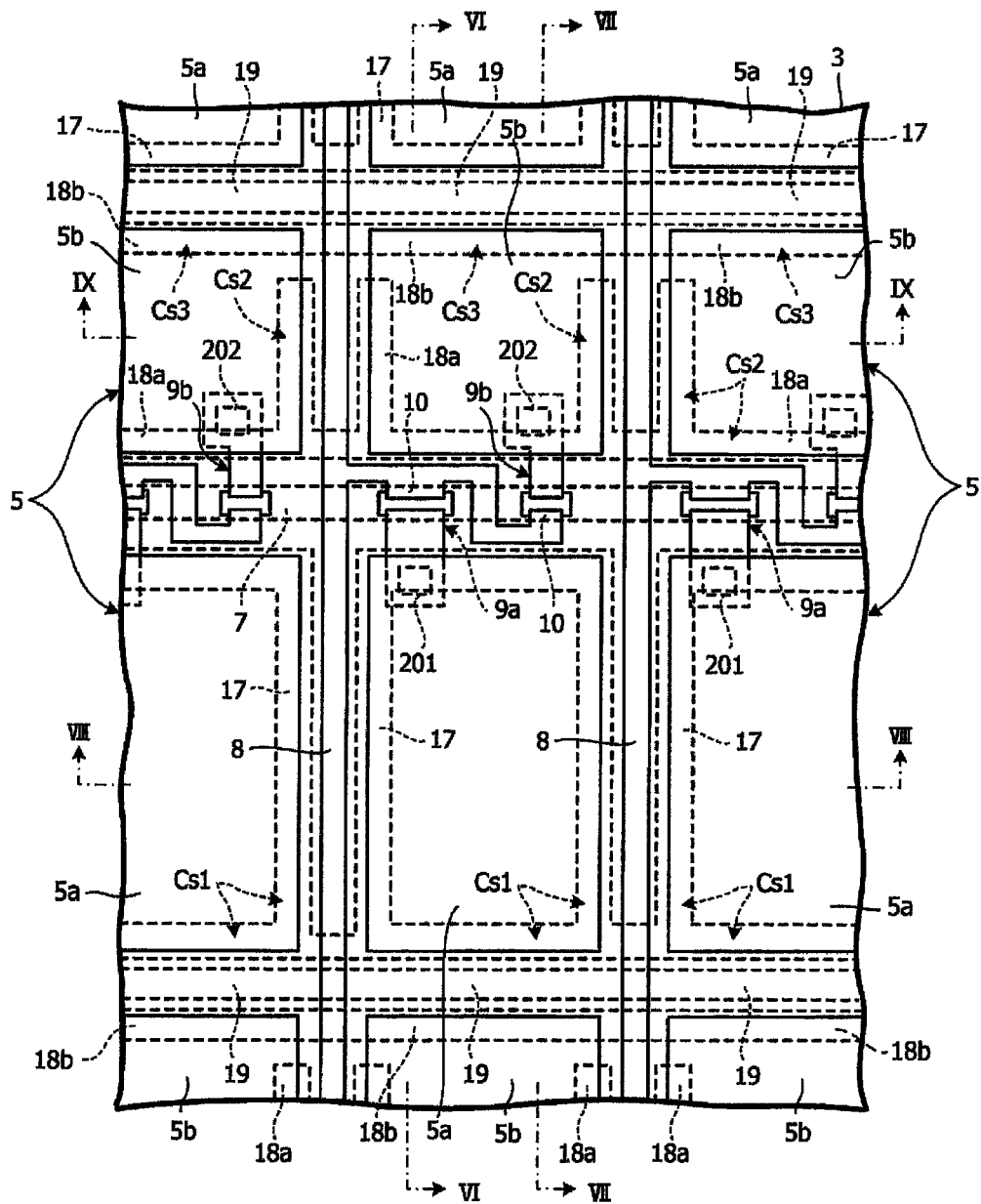
FIG. 4 is a partially enlarged plan view of a first substrate of the liquid crystal display device (a coating insulating film and an alignment film are not shown)
Figure 5:
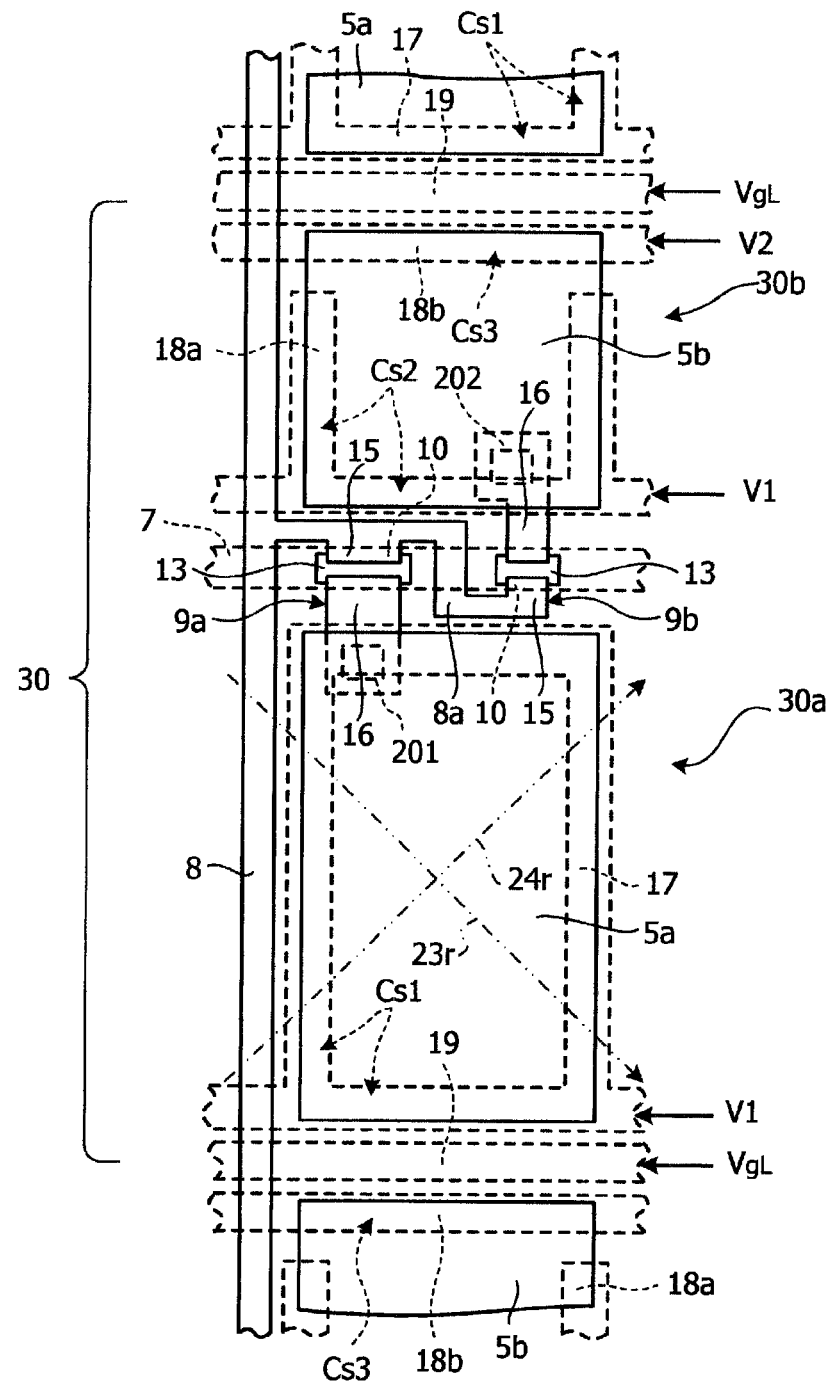
FIG. 5 is a further enlarged view of FIG. 4.
Figure 6:
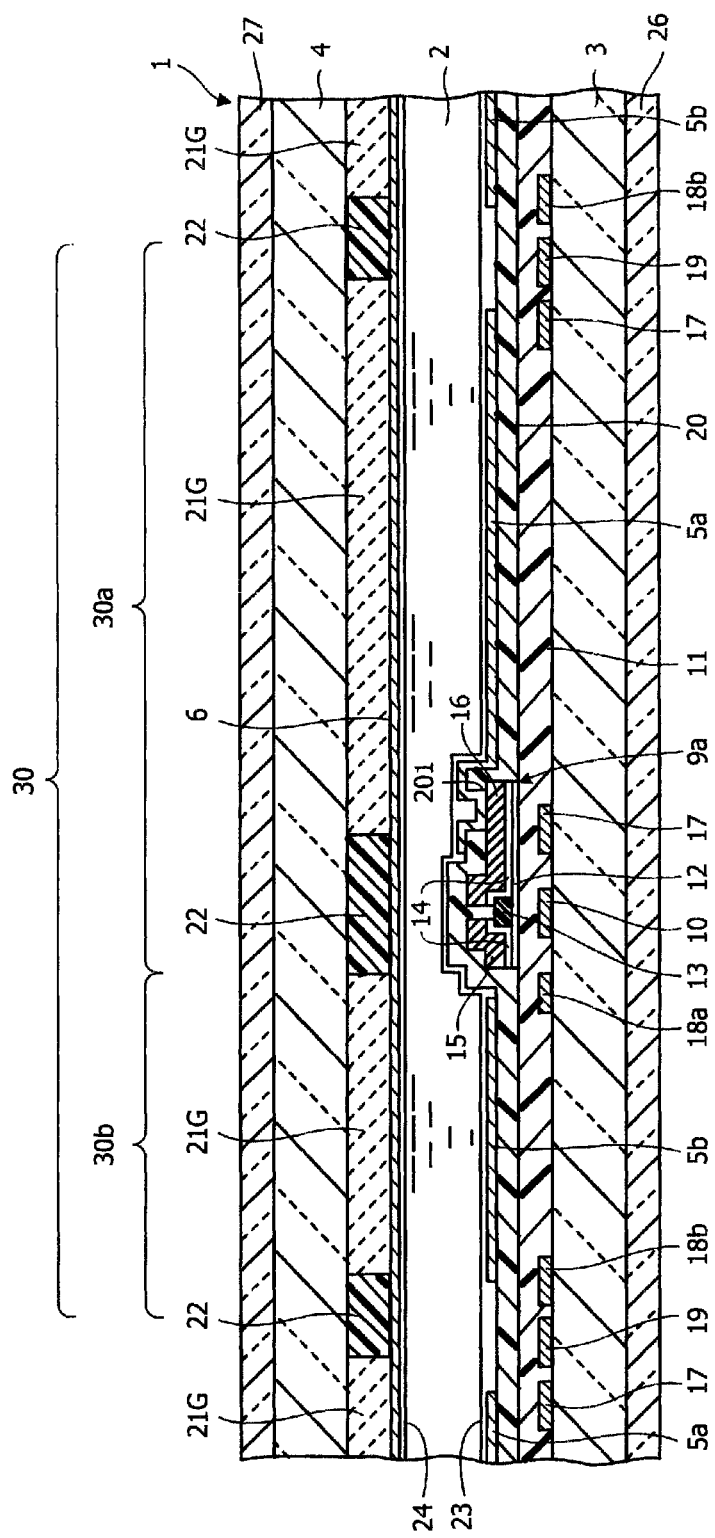
FIG. 6 is an enlarged sectional view along the line VI-VI of FIG. 4.
Figure 7:
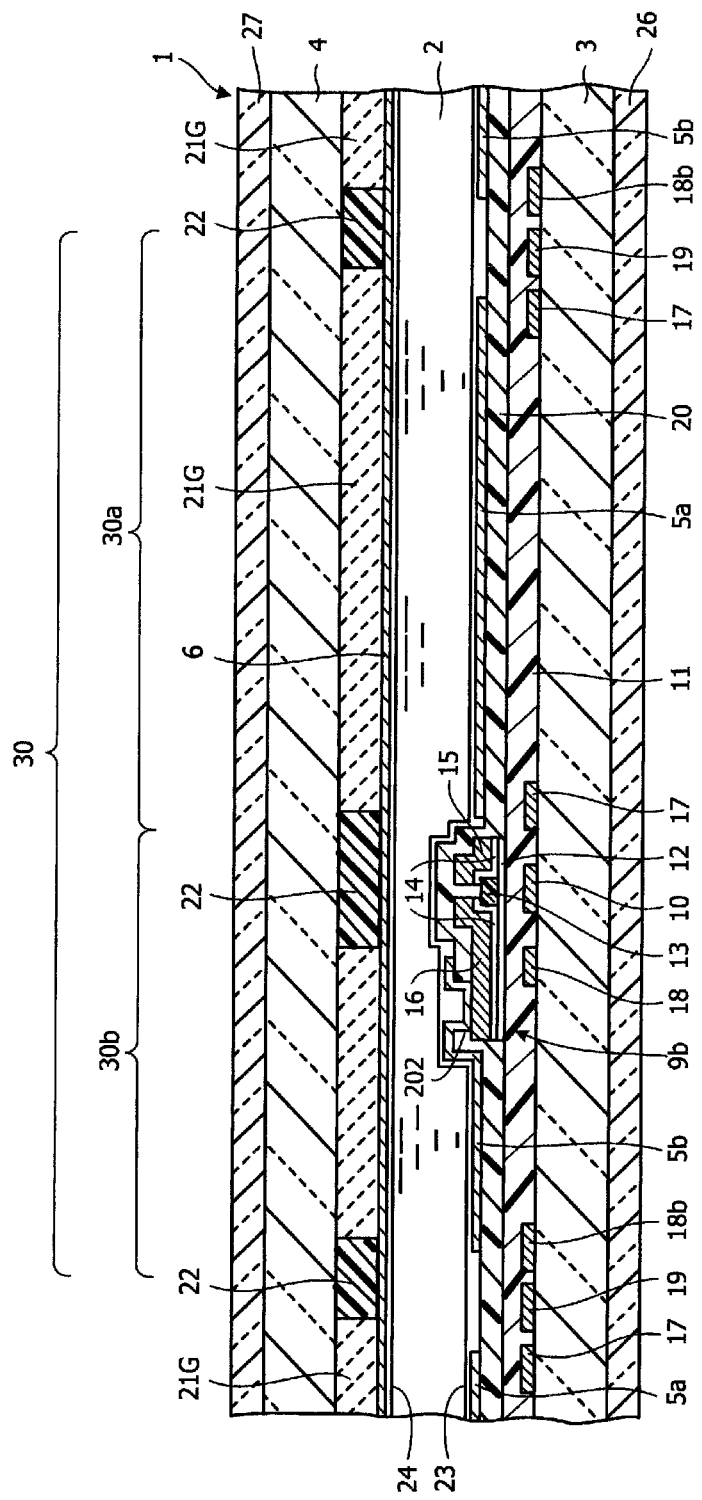
FIG. 7 is an enlarged sectional view along the line VII-VII of FIG. 4.
Figure 8:
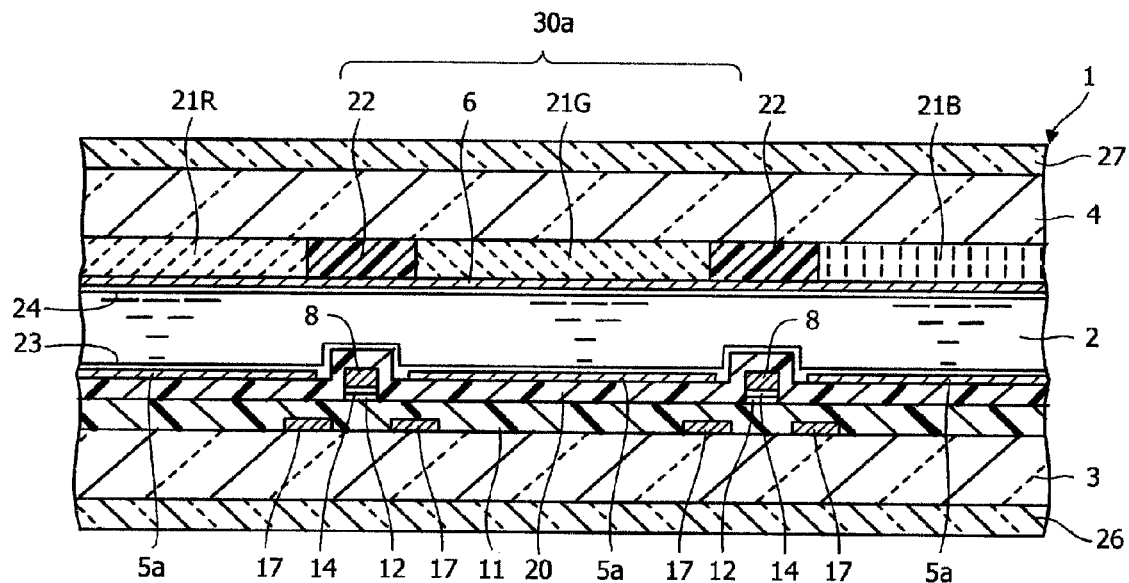
FIG. 8 is an enlarged sectional view along the line VIII-VIII of FIG. 4.
Figure 9:
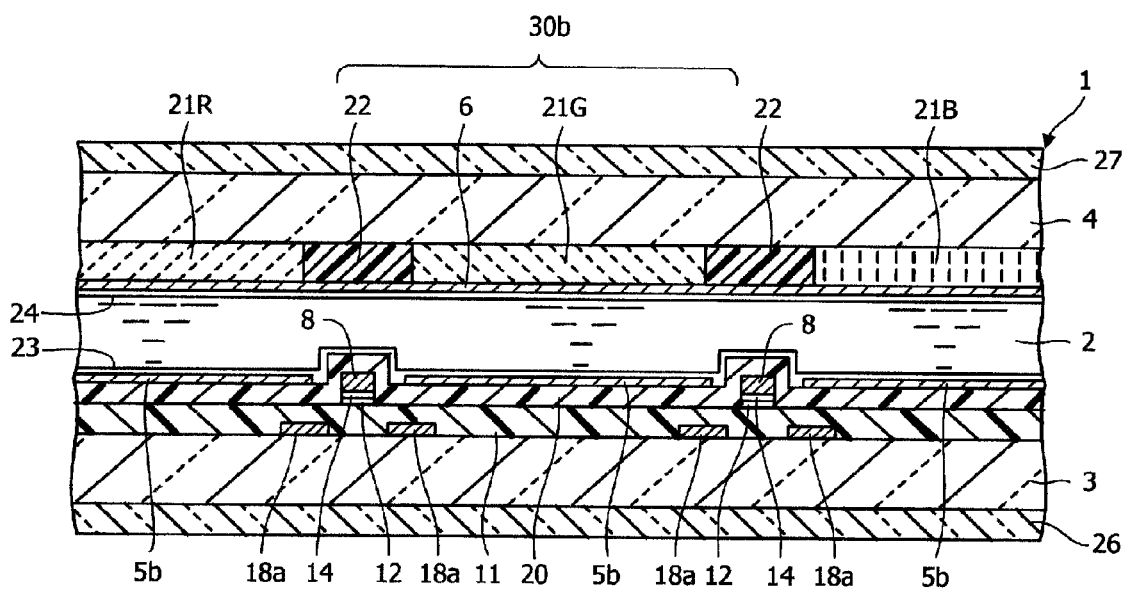
FIG. 9 is an enlarged sectional view along the line IX-IX of FIG. 4.
Figure 10:
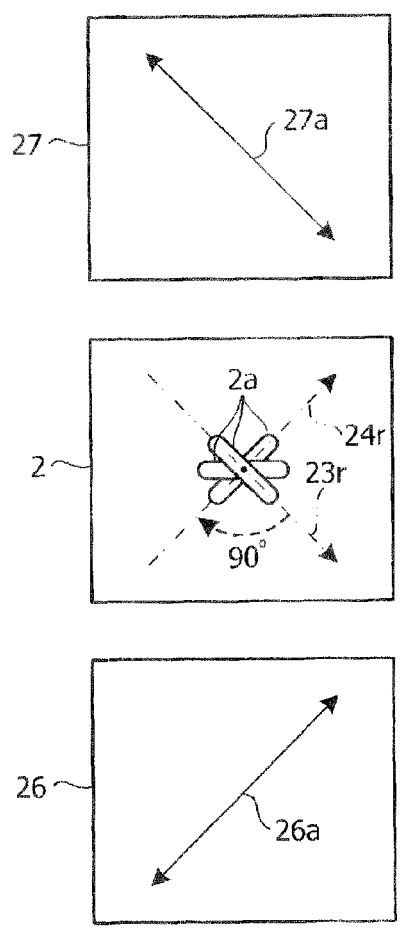
FIG. 10 is a plan view showing an initial alignment of liquid crystal molecules in the liquid crystal display device, and the directions of absorption axes of first and second polarizing plates.

As shown in FIG. 4, FIG. 5, and FIG. 10, the first capacitive electrode 17 is in a rectangular frame shape corresponding to the outer shape of the first pixel electrode 5a to overlap all the sides of the first pixel electrode 5a. The edge of each of the sides of the first capacitive electrode 17 opposite to the side that overlaps the first pixel electrode 5a is formed to have a width slightly bulging out of the first pixel electrode 5a. The first capacitive electrodes 17 of the pixels 30 are connected together by seamlessly forming the ends of the sides of the neighboring first capacitive electrodes 17, 17 opposite to their sides adjacent to the scan signal line 7 in each row.

On the other hand, of the second capacitive electrode 18a and the third capacitive electrode 18b, the third capacitive electrode 18b is formed to extend in a direction along predetermined one side of the second pixel electrode 5b and overlap this predetermined side, and the second capacitive electrode 18a is formed to overlap the other sides of the second pixel electrode 5b except for the above-mentioned predetermined side at a distance from the third capacitive electrode 18b.

In this embodiment, the third capacitive electrode 18b is in a linear shape that overlaps a lateral side opposite to the side adjacent to the scan signal line 7, of the two sides (hereinafter referred to as lateral sides) of the second pixel electrode 5b parallel to the extending direction of the scan signal line 7. The edge of the side of the third capacitive electrode 18b opposite to the side overlapping the second pixel electrode 5b is formed to have a width slightly bulging out of the second pixel electrode 5b. The third capacitive electrodes 18b of the pixels 30 are connected together by seamlessly forming the ends of the sides of the neighboring third capacitive electrodes 18b, 18b in each row.

The second capacitive electrode 18a is in a three-way frame shape that overlaps the lateral side of the second pixel electrode 5b adjacent to the scan signal line 7 and two sides (hereinafter referred to as longitudinal sides) of the second pixel electrode 5b intersecting with the extending direction of the scan signal line 7. The edge of each of the sides of the second capacitive electrode 18a opposite to the side overlapping the second pixel electrode 5b is formed to have a width slightly bulging out of the second pixel electrode 5b. The second capacitive electrodes 18a of the pixels 30 are connected together by seamlessly forming the ends of the sides of the neighboring second capacitive electrodes 18a, 18a adjacent to the scan signal line 7 in each row.

The first substrate 3 is further provided with an auxiliary electrode 19. The auxiliary electrode 19 is disposed, to face the common electrode 6, in a region between the first pixel electrode 5a of the first pixel 30 of the first and second pixels 30, 30 adjacent in a direction (direction along the data signal line 8) that intersects with the extending direction of the scan signal line 7, and the second pixel electrode 5b of the second pixel 30. The auxiliary electrode 19 is formed to extend in a direction along the sides of the first pixel electrode 5a and the second pixel electrode 5b adjacent to each other. That is, the auxiliary electrode 19 is formed so that its extending direction is parallel to the extending direction of the scan signal line 7. In other words, the auxiliary electrode 19 is formed so that its extending direction is perpendicular to the extending direction of the data signal line 8.

The auxiliary electrode 19 is in a linear shape smaller in width than the distance between the first pixel electrode 5a of the first pixel 30 and the second pixel electrode 5b of the second pixel 30, and is disposed so that the distance between the auxiliary electrode 19 and the first pixel electrode 5a is equal to the distance between the auxiliary electrode 19 and the second pixel electrode 5b. That is, the auxiliary electrode 19 is located so as not to overlap the first pixel electrode 5a of the first pixel 30 and the second pixel electrode 5b of the second pixel 30. The auxiliary electrode 19 has a width smaller than the distance between the first capacitive electrode 17 of the first pixel 30 and the third capacitive electrode 18b of the second pixel 30. The auxiliary electrode 19 is located at a distance from the first capacitive electrode 17 and at a distance from the third capacitive electrode 18b. The auxiliary electrodes 19 are connected together by seamlessly forming the ends of the neighboring auxiliary electrodes 19, 19 in each row.

In this embodiment, the first, second and third capacitive electrodes 17, 18a, and 18b and the auxiliary electrode 19 are formed on the first substrate 3 by the same metal film as the gate electrode 10 of each of the TFTs 9a and 9b and the scan signal line 7. That is, the metal film as a light-shielding conducting film in the form of a single film is patterned to form the first, second and third capacitive electrodes 17, 18a, and 18b, the auxiliary electrode 19, the gate electrode 10, and the scan signal line 7. Thus, the first, second and third capacitive electrodes 17, 18a, and 18b, the auxiliary electrode 19, the gate electrode 10, and the scan signal line 7 are formed as the same layer.

The first capacitive electrode 17 faces each side of the first pixel electrode 5a through the first dielectric layer comprising a two-layer film of the gate insulating film 11 and the coating insulating film 20, so as to form the first compensating capacity Cs1 between this first capacitive electrode 17 and the first pixel electrode 5a.

The second capacitive electrode 18a faces the lateral side of the second pixel electrode 5b adjacent to the scan signal line 7 and its two longitudinal lines through the second dielectric layer comprising a two-layer film of the gate insulating film 11 and the coating insulating film 20, so as to form the second compensating capacity Cs2 between this second capacitive electrode 18a and the second pixel electrode 5b.

The third capacitive electrode 18b faces the lateral side of the second pixel electrode 5b opposite to the side adjacent to the scan signal line 7 through the third dielectric layer comprising a two-layer film of the gate insulating film 11 and the coating insulating film 20, so as to form the third compensating capacity Cs3 between this third capacitive electrode 18b and the second pixel electrode 5b.

That is, the first dielectric layer of the first compensating capacity Cs1, the second dielectric layer of the second compensating capacity Cs2, and the third dielectric layer of the third compensating capacity Cs3 are formed as the same layer (the two-layer film of the gate insulating film 11 and the coating insulating film 20).

On the other hand, as shown in FIG. 6 to FIG. 9, color filters of three colors, i.e., a red filter 21R, a green filter 21G, and a blue filter 21B are alternately formed on the second substrate 4 in each row of each of the pixels 30. Moreover, light-shielding films 22 are formed on the second substrate 4 to correspond to a region between the adjacent pixels 30, 30 in each row and each column and to correspond to a region between the first region 30a and the second region 30b of each of the pixels 30.

In this embodiment, the light-shielding film 22 is made of, for example, a photosensitive resin to which a black pigment is added. The three-color color filters 21R, 21G, and 21B are formed in regions on the second substrate 4 without the light-shielding films 22. The common electrode 6 is formed on the color filters 21R, 21G, and 21B and the light-shielding film 22 all over the region where the pixels 30 are arranged.

The first substrate 3 is further provided with a first alignment film 23 over the first pixel electrode 5a and the second pixel electrode 5b. The second substrate 4 is provided with a second alignment film 24 over the common electrode 6. The alignment films 23 and 24 are homogeneous alignment films made of, for example, polyimide. The surface of each film is rubbed in a direction that intersects with the extending direction of the auxiliary electrode 19.

Figure 3:
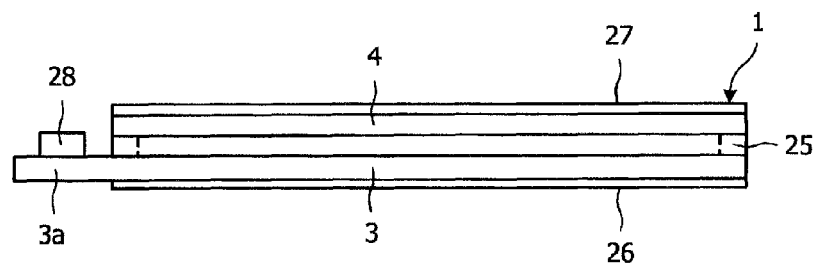
FIG. 3 is a side view of the liquid crystal display device.

As shown in FIG. 2 and FIG. 3, the first substrate 3 and the second substrate 4 are disposed to face each other with a gap, and affixed to each other through a frame-shaped seal member 25 enclosing a screen area 1a. A liquid crystal layer 2 is formed between the first pixel electrode 5a and the common electrode 6 and between the second pixel electrode 5b and the common electrode 6. The liquid crystal layer 2 is formed by liquid crystal contained in a sealed state in a region of the gap enclosed by the seal member 25 between the first substrate 3 and the second substrate 4.

A first polarizing plate 26 is located on the outer surface of the first substrate 3 to have its absorption axis in a predetermined direction. A second polarizing plate 27 is located on the outer surface of the second substrate 4 to have its absorption axis in a predetermined direction.

The liquid crystal display device 1 according to this embodiment is, for example, a TN liquid crystal display device. The first alignment film 23 and the second alignment film 24 are rubbed in directions perpendicular to each other as aligning treatment for pretilting liquid crystal molecules at a predetermined tilt angle. That is, in FIG. 10, an arrow 23r indicates the direction of rubbing treatment the first alignment film 23, and an arrow 24r indicates the direction of rubbing treatment the second alignment film 24. As shown in FIG. 10, the first alignment film 23 is rubbed in a direction intersecting with the extending direction (a direction parallel to the lateral axis direction of the screen area 1a) of the auxiliary electrode 19 at an angle of 45° in a first direction (a clockwise direction in the diagram). The second alignment film 24 is rubbed in a direction intersecting with the extending direction of the auxiliary electrode 19 at an angle of 45° in a second direction (a counterclockwise direction in the diagram) opposite to the first direction.

The liquid crystal layer 2 comprises nematic liquid crystal having positive dielectric anisotropy. As shown in FIG. 10, the long axis of a liquid crystal molecule 2a of the liquid crystal layer 2 is arranged in the rubbing direction 23r of the first alignment film 23 in the vicinity of the first substrate 3, and is arranged in the rubbing direction 24r of the second alignment film 24 in the vicinity of the second substrate 4. The liquid crystal molecule 2a is twist-aligned at a twist angle of 90° in the direction of a dashed arrow indicated in FIG. 10 between the first substrate 3 and the second substrate 4, that is, between the first pixel electrode 5a as well as the second pixel electrode 5b and the common electrode 6 so that the liquid crystal molecule 2a is pretilted in a direction to depart from the surface of the alignment film from the upstream side (rubbing start end) to the downstream side (rubbing completion end) of the rubbing directions 23r and 24r.

The angles of the rubbing directions 23r and 24r of the first alignment film 23 and the second alignment film 24 with the extending direction of the auxiliary electrode 19 does not have to be exactly 45°. The twist angle of the liquid crystal molecule 2a does not have to be exactly 90° either. That is, an error of about ±5° is permitted for the angles of the rubbing directions 23r and 24r of the alignment films 23 and 24 with the extending direction of the auxiliary electrode 19, and an error of about ±10° is permitted for the twist angle of the liquid crystal molecule 2a.

The first polarizing plate 26 and the second polarizing plate 27 are disposed to configure a normally-white-mode liquid crystal display device which provides the brightest display when a voltage applied across the first pixel electrode 5a as well as the second pixel electrode 5b and the common electrode 6 is 0V. That is, as shown in FIG. 10, the first polarizing plate 26 is disposed to have its absorption axis 26a in a direction perpendicular or parallel (perpendicular in the diagram) to the rubbing direction 23r of the first alignment film 23, and the second polarizing plate 27 is disposed to have its absorption axis 27a in a direction perpendicular to the absorption axis 26a of the first polarizing plate 26.

As shown in FIG. 2 and FIG. 3, a driver mounting portion 3a bulging out of the second substrate 4 is formed in the first substrate 3, for example, on one side of the screen area 1a in the longitudinal direction (column direction). A driver element 28 is mounted on the driver mounting portion 3a. The driver element 28 comprises an LSI in which input terminals, scan signal output terminals, and data signal output terminals (not shown) are formed.

Each of the scan signal lines 7 is connected to each of the scan signal output terminals of the driver element 28 around the outside of the screen area 1a. Each of the data signal lines 8 is connected to each of the data signal output terminals of the driver element 28.

In the driver mounting portion 3a, one first voltage input terminal 29a, one second voltage input terminal 29b, and one auxiliary voltage input terminal 29c are formed. Moreover, the common electrode 6 is connected to the first voltage input terminal 29a through a cross connection (not shown) provided in a substrate coupling portion formed by the frame-shaped seal member 25.

Although not shown, one first voltage supply line connected to the first voltage input terminal 29a, one second voltage supply line connected to the second voltage input terminal 29b, and one auxiliary voltage supply line connected to the auxiliary voltage input terminal 29c are laid on the first substrate 3 parallel to the data signal lines 8 outside the screen area 1a.

The first capacitive electrodes 17 in all of the rows connected together in each row and the second capacitive electrodes 18a in all of the rows connected together in each row are connected to the one first voltage supply line, and are connected to the first voltage input terminal 29a through the first voltage supply line together with the common electrode 6. The third capacitive electrodes 18b in all of the rows connected together in each row are connected to the one second voltage supply line, and are connected to the second voltage input terminal 29b through the second voltage supply line. The auxiliary electrodes 19 in all of the rows connected together in each row are connected to the one auxiliary voltage supply line, and are connected to the auxiliary voltage input terminal 29c through the auxiliary voltage supply line.

The liquid crystal display device 1 is driven by sequentially selecting the rows (hereinafter referred to as pixel rows) of the pixels 30 one by one and applying a voltage across the first pixel electrode 5a as well as the second pixel electrode 5b in each of the pixels 30 and the common electrode 6 for each pixel row. An image is displayed by controlling the transmission of light in the first region 30a and the second region 30b of the pixel 30 in accordance with the change of alignment condition of liquid crystal molecules with the application of the voltage. In the rear (opposite side of the side of the display surface) of this liquid crystal display device 1, a surface light source (not shown) is disposed to apply light having uniform illumination to the whole screen area 1a.

Now, the driving unit 31 for driving the liquid crystal display device 1 is described. As shown in FIG. 1, the driving unit 31 comprises an image memory 32 for temporarily storing externally input gradation data, a scan signal line drive circuit 33 for applying a scan signal to the scan signal lines 7 of the liquid crystal display device 1, a data signal line drive circuit 34 for applying a data signal to the data signal lines 8 of the liquid crystal display device 1, a first voltage generating circuit 35 and a second voltage generating circuit 36, and a control unit 37 for all of the above components. The scan signal line drive circuit 33 and the data signal line drive circuit 34 are formed in the driver element 28 mounted on the driver mounting portion 3a of the liquid crystal display device 1.

The driving unit 31 further comprises a scan signal power source 38 for generating a gate on voltage $Vg_H$ having a predetermined value for switching on the first TFT 9a and the second TFT 9b, and a gate off voltage $Vg_L$ having a predetermined value for switching off the first TFT 9a and the second TFT 9b.

The gate on voltage $Vg_H$ and the gate off voltage $Vg_L$ are supplied to the scan signal line drive circuit 33 from the scan signal power source 38. The scan signal line drive circuit 33 thus applies a scan signal to each of the scan signal lines 7 in accordance with a control signal such as a synchronizing clock signal from the control unit 37. The scan signal has a voltage value that change with the gate on voltage $Vg_H$ and the gate off voltage $Vg_L$ in a time-series manner.

Figure 12:
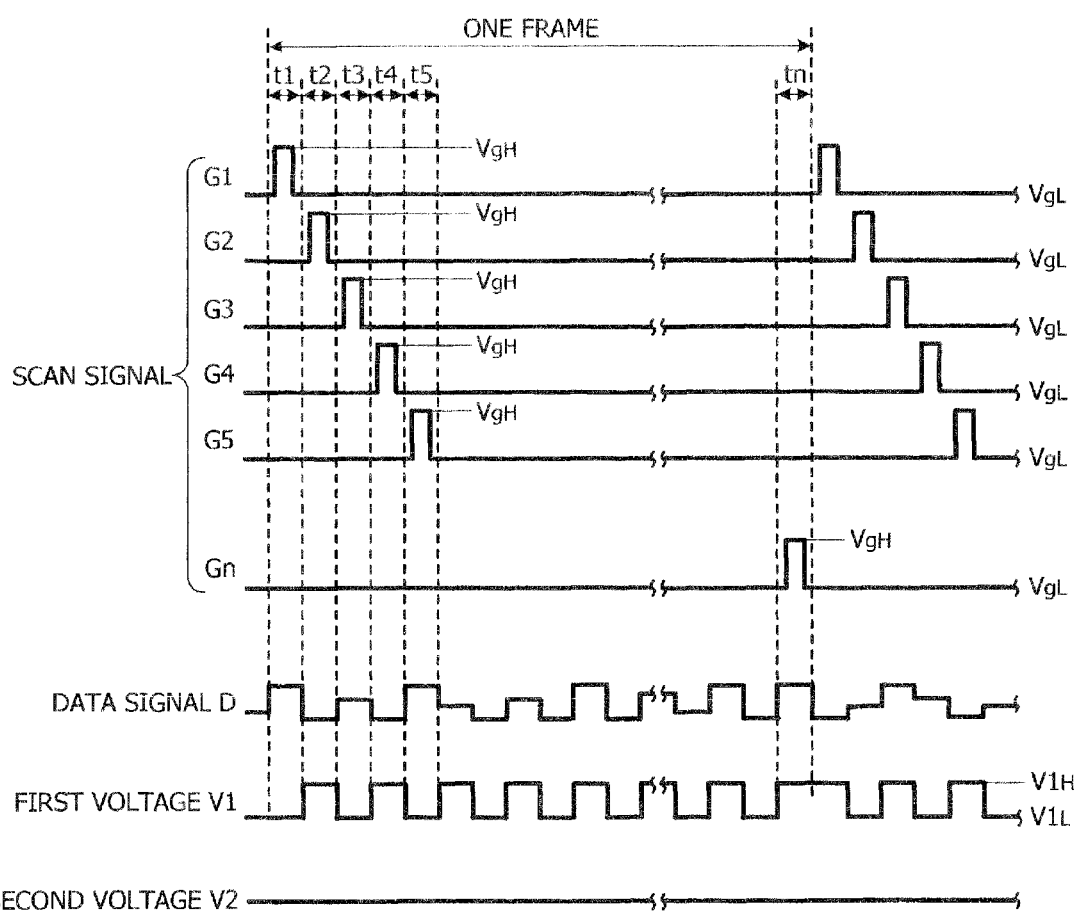
FIG. 12 is a waveform chart of scan signals for driving the liquid crystal display device, a data signal, and first and second voltages.

In FIG. 12, t1, t2, t3, t4, . . . tn are periods of selecting the pixel rows which are obtained by dividing one frame for displaying one screen (a period of sequentially selecting the pixel rows from the first row to the last row and applying a voltage corresponding to the gradation data to the pixels 30 in all of the pixel rows) by the number of rows of the pixels. t1 is a period of selecting the first row, t2 is a period of selecting the second row, t3 is a period of selecting the third row, t4 is a period of selecting the fourth row, t5 is a period of selecting the fifth row, and to is a period of selecting the last row (n row).

Moreover, in FIG. 12, G1, G2, G3, G4, . . . Gn are scan signals applied to the scan signal lines 7. G1 is a scan signal applied to the scan signal line 7 in the first row, G2 is a scan signal applied to the scan signal line 7 in the second row, G3 is a scan signal applied to the scan signal line 7 in the third row, G4 is a scan signal applied to the scan signal line 7 in the fourth row, G5 is a scan signal applied to the scan signal line 7 in the fifth row, and Gn is a scan signal applied to the scan signal line 7 in the last row (n row).

These scan signals have waveforms that reach the gate on voltage $Vg_H$ at the start of writing a predetermined time behind the starts of the selecting periods t1, t2, t3, t4, . . . tn in the pixel rows to which the scan signal lines 7 for applying the scan signals correspond to, and reach the gate off voltage $Vg_L$ at the end of writing a predetermined time ahead of the ends of the selecting periods t1, t2, t3, t4, . . . tn. The scan signals are held at the gate off voltage $Vg_L$ during non-selecting periods.

Thus, the first TFT 9a and the second TFT 9b of the pixel 30 in each row are switched on, during the period of selecting this row, by the scan signal of the gate on voltage $Vg_H$ at the start of writing, and switched off by the scan signal of the gate off voltage $Vg_L$ at the end of writing after a certain period of time.

The data signal line drive circuit 34 takes in the gradation data temporarily stored in the image memory 32 via the control unit 37 for each of the pixel rows in accordance with the control signal from the control unit 37. The data signal line drive circuit 34 converts a digital signal as the gradation data into a voltage as an analog data signal, and supplies the converted voltage to the corresponding the data signal line 8 synchronously with the selecting period.

A data signal D shown in FIG. 12 indicates a signal applied to one of the data signal lines 8. This data signal D can be indicated as a rectangular-wave signal having a potential that changes with the gradation data for each of the selecting periods t1, t2, t3, t4, . . . tn.

The data signal D supplied to the data signal line 8 is applied to the first pixel electrode 5a and the second pixel electrode 5b of the pixel 30 in the selected row in accordance with the timing of switching on the first TFT 9a and the second TFT 9b.

The first voltage generating circuit 35 generates a first voltage V1 in accordance with the control signal from the control unit 37. The first voltage V1 is applied to the common electrode 6 and to the first capacitive electrode 17 and the second capacitive electrode 18a in each row via the first voltage input terminal 29a. That is, the first voltage V1 applied to the first capacitive electrode 17 and the second capacitive electrode 18a in each row is the same as the voltage applied to the common electrode 6.

In this embodiment, the first voltage V1 applied to the common electrode 6 and to the first capacitive electrode 17 and the second capacitive electrode 18a in each row from the first voltage generating circuit 35 is a rectangular-wave alternating voltage. As shown in FIG. 12, the level of this rectangular-wave alternating voltage is inverted (switched) between a high-level value $V1_H$ and a low-level value $V1_L$, in each of the pixel row selecting periods t1, t2, t3, t4, . . . tn. Moreover, when attention is focused on a row, the voltage level is inverted frame by frame in the selecting period of this row. The first voltage applied to the common electrode 6 is hereinafter referred to as a common signal Vcom so that this voltage is easily distinguished from the first voltages applied to the other electrodes.

On the other hand, the second voltage generating circuit 36 generates a second voltage V2 different from the first voltage V1 in accordance with the control signal from the control unit 37. In this embodiment, the second voltage V2 is a constant-level direct-current voltage as shown in FIG. 12, and is applied to the third capacitive electrode 18b in each of the rows via the second voltage input terminal 29b.

Figure 13:
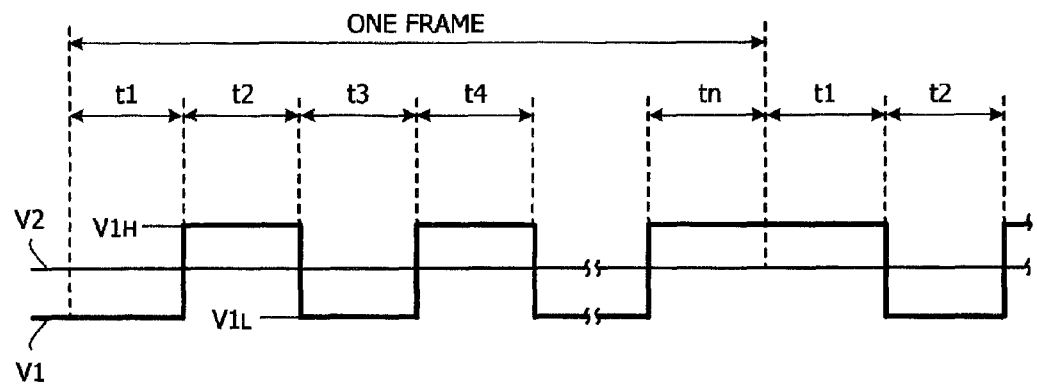
FIG. 13 is a diagram showing the relation between the first voltage and the second voltage.

In this embodiment, the second voltage V2 is a voltage having a value between the high-level value $V1_H$ and the low-level value $V1_L$ of the first voltage V1, for example, a voltage having a value between the high-level value $V1_H$ and the low-level value $V1_L$, as shown in FIG. 13.

Thus, the driving unit 31 applies the same first voltage V1 to the first capacitive electrode 17 and the second capacitive electrode 18a as the voltage applied to the common electrode 6, and applies, to the third capacitive electrode 18b, the second voltage V2 different from the first voltage V1.

Figure 11:
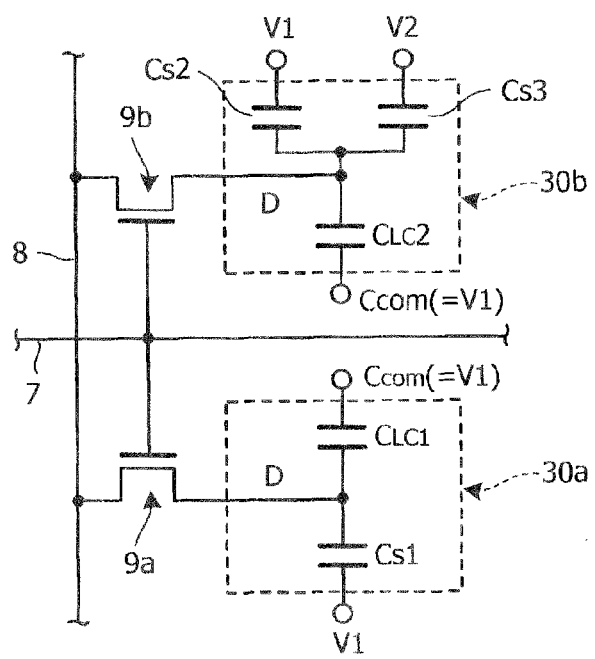
FIG. 11 is an equivalent circuit diagram of one pixel of the liquid crystal display device.

In this liquid crystal display apparatus, each of the pixels 30 of the liquid crystal display device 1 can be shown by an equivalent circuit in FIG. 11. That is, the first region 30a of one pixel 30 can be shown by an equivalent circuit in which a first pixel capacity $C_{LC}1$ and the first compensating capacity Cs1 are connected in the first pixel electrode 5a and in which the first TFT 9a is connected to the first pixel electrode 5a. The first pixel capacity $C_{LC}1$ comprises the first pixel electrode 5a, the common electrode 6, and the liquid crystal layer 2 therebetween. The first compensating capacity Cs1 comprises the first pixel electrode 5a, the first capacitive electrode 17, and the first dielectric layer (the two-layer film of the gate insulating film 11 and the coating insulating film 20) therebetween.

The second region 30b of the above-mentioned pixel 30 can be shown by an equivalent circuit in which a second pixel capacity $C_{LC}2$, the second compensating capacity Cs2, and the third compensating capacity Cs3 are connected in the second pixel electrode 5b and in which the second TFT 9b is connected to the second pixel electrode 5b. The second pixel capacity $C_{LC}2$ comprises the second pixel electrode 5b, the common electrode 6, and the liquid crystal layer 2 therebetween. The second compensating capacity Cs2 comprises the second pixel electrode 5b, the second capacitive electrode 18a, and the second dielectric layer (the two-layer film of the gate insulating film 11 and the coating insulating film 20) therebetween. The third compensating capacity Cs3 comprises the second pixel electrode 5b, the third capacitive electrode 18b, and the third dielectric layer (the two-layer film of the gate insulating film 11 and the coating insulating film 20) therebetween.

The common signal Vcom the level of which is switched between the high-level value V1H and the low-level value V1L in each of the pixel row selecting periods is applied to the common electrode 6. The first voltage V1 equal to the common signal Vcom is applied to the first capacitive electrode 17 and the second capacitive electrode 18a. The second voltage V2 different from the first voltage V1 is applied to the third capacitive electrode 18b.

The data signal D supplied from the data signal line 8 is applied to the first pixel electrode 5a and the second pixel electrode 5b of each of the pixels 30 in the selected pixel row when the first TFT 9a and the second TFT 9b are switched on.

Each of the voltages (hereinafter referred to as write voltages) applied across the first pixel electrode 5a and the common electrode 6 and across the second pixel electrode 5b and the common electrode 6 has a value corresponding to the voltage difference between the first voltage V1 and the data signal D. The first pixel capacity $C_{LC}1$ and the second pixel capacity $C_{LC}2$ are charged with these write voltages.

The first voltages V1 equal to the common signal Vcom applied to the common electrode 6 are applied to the first capacitive electrode 17 and the second capacitive electrode 18a, respectively. Thus, the first compensating capacity Cs1 and the second compensating capacity Cs2 are charged with the voltages equal to the write voltage, respectively.

On the other hand, the voltage applied to the third capacitive electrode 18b is the second voltage V2 different from the first voltage V1. Therefore, the third compensating capacity Cs3 is charged with a voltage different from the write voltage (a voltage having a voltage difference between this voltage and the write voltage corresponding to the difference between the first voltage V1 and the second voltage V2).

Moreover, a parasitic capacitance (hereinafter referred to as a first parasitic capacitance) such as a gate-source capacitance and a drain-source capacitance of the first TFT 9a is present between the first pixel electrode 5a and the scan signal line 7 as well as the data signal line 8. A parasitic capacitance (hereinafter referred to as a second parasitic capacitance) such as a gate-source capacitance and a drain-source capacitance of the second TFT 9b is present between the second pixel electrode 5b and the scan signal line 7 as well as the data signal line 8.

Therefore, if the first TFT 9a and the second TFT 9b are switched off and writing is finished, the voltages that have charged the first pixel capacity $C_{LC}1$ and the second compensating capacity Cs2 are slightly dropped by a voltage fed to the first parasitic capacitance, and the voltage that has charged the second pixel capacity $C_{LC}2$, the second compensating capacity Cs2, and the third compensating capacity Cs3 is slightly dropped by a voltage fed to the second parasitic capacitance.

The liquid crystal in the first region 30a of the pixel 30 is driven by the charge voltage of the first pixel capacity $C_{LC}1$ (the voltage across the first pixel electrode 5a and the common electrode 6). The liquid crystal in the second region 30b of the pixel 30 is driven by the charge voltage of the second pixel capacity $C_{LC}2$ (the voltage across the second pixel electrode 5b and the common electrode 6).

Figure 14:
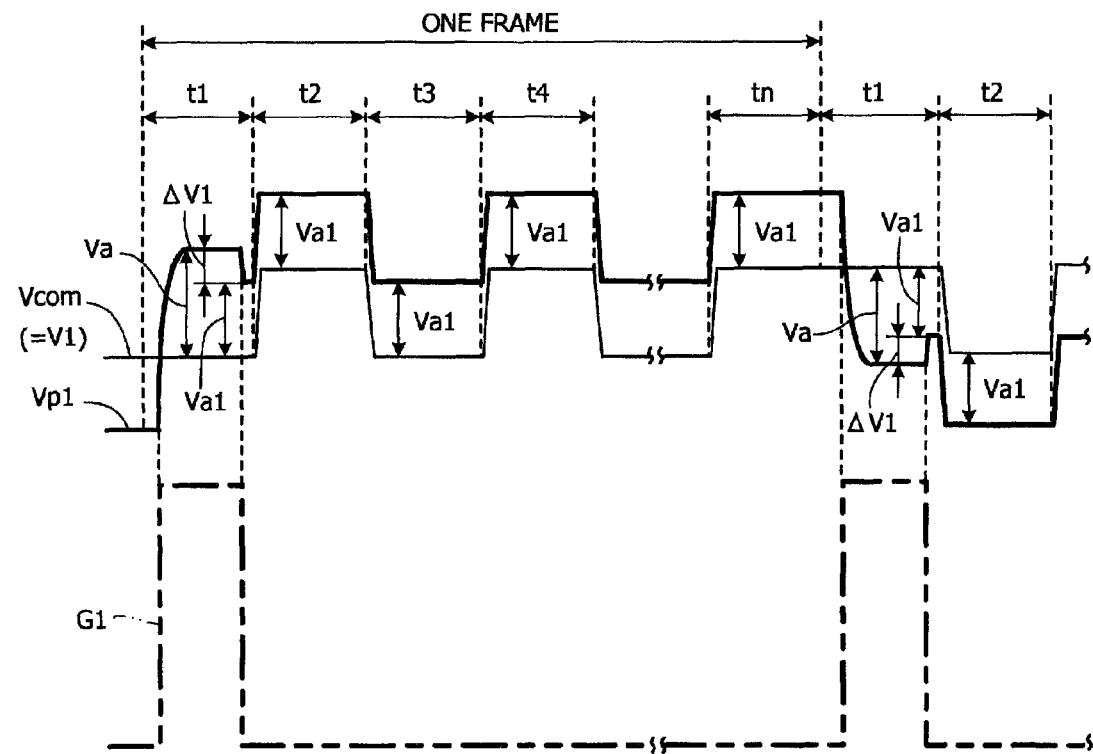
FIG. 14 is a diagram showing a voltage applied to a liquid crystal layer (a liquid crystal layer in a first region) between a first pixel electrode and a common electrode.
Figure 15:
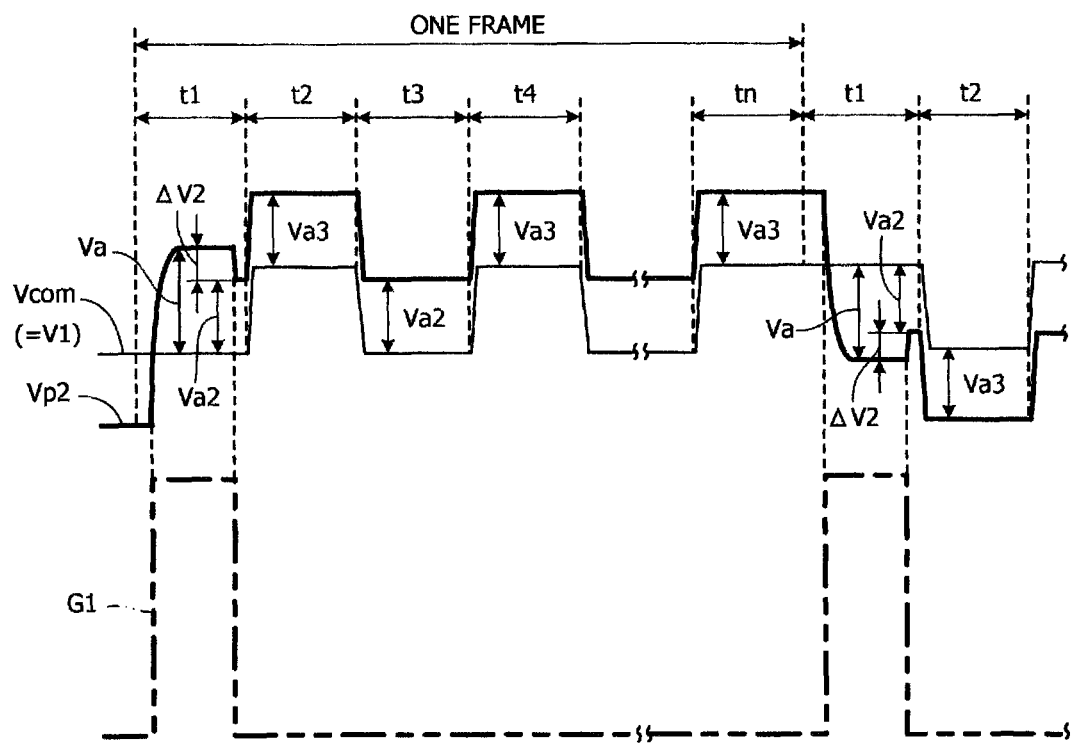
FIG. 15 is a diagram showing a voltage applied to a liquid crystal layer (a liquid crystal layer in a second region) between a second pixel electrode and the common electrode.

FIG. 14 shows the voltage applied across the first pixel electrode 5a in the first region 30a of one of the pixels 30 in the first row and the common electrode 6. FIG. 15 shows the voltage applied across the second pixel electrode 5b in the second region 30b of the same pixel 30 and the common electrode 6. In FIG. 14, $V_P1$ is the potential of the first pixel electrode 5a. In FIG. 15, $V_P2$ is the potential of the second pixel electrode 5b. In FIG. 14 and FIG. 15, in order to easily distinguish the potentials $V_P1$ and $V_P2$ of the first pixel electrode 5a and the second pixel electrode 5b from the common signal Vcom, their rises and falls are slanted.

As shown in FIG. 14, the voltage across the first pixel electrode 5a and the common electrode 6 reaches a write voltage Va corresponding to the potential difference between the data signal D applied to the first pixel electrode 5a from the first TFT 9a via the data signal line 8 and the common signal Vcom applied to the common electrode 6 during the period in which the TFTs 9a and 9b are on within the selecting period t1 for the first row.

When the first TFT 9a is switched off, the voltage across the first pixel electrode 5a and the common electrode 6 reaches a voltage Va1 lower than the write voltage Va by a fed voltage $\Delta V1$ attributed to the first parasitic capacitance. This voltage Va1 is hereinafter referred to as a first retention voltage.

The level of the common signal Vcom applied to the common electrode 6 is inverted in each of the pixel row selecting periods t1, t2, t3, t4, . . . tn. However, the common signal Vcom is the same as the first voltage V1 applied to the first capacitive electrode 17. Therefore, even if the voltage level of the common signal Vcom is inverted, the charge voltages of the first pixel capacity $C_{LC}1$ and the first compensating capacity Cs1 do not change. Thus, the voltage across the first pixel electrode 5a and the common electrode 6 is also held at the first retention voltage Va1 in the selecting periods t2, t3, t4, . . . tn of the second and following pixel rows.

Accordingly, regardless of whether the voltage level of the common signal Vcom is inverted, the first retention voltage Va1 across the first pixel electrode 5a and the common electrode 6 is kept at the voltage substantially equal to the first retention voltage Va1 in the selecting period t1 for the first row during a period from the end of writing in the selecting period t1 for the first row to the end of one frame. This voltage is applied to the liquid crystal in the first region 30a as an effective voltage for one frame.

As shown in FIG. 15, the voltage across the second pixel electrode 5b and the common electrode 6 reaches a write voltage Va corresponding to the potential difference between the data signal D applied to the second pixel electrode 5b from the data signal line 8 via the second TFT 9b and the common signal Vcom applied to the common electrode 6 during the period in which the TFTs 9a and 9b are on within the selecting period t1 for the first row. This write voltage Va has the same value as the write voltage Va applied across the first pixel electrode 5a and the common electrode 6.

When the second TFT 9b is switched off, the voltage across the second pixel electrode 5b and the common electrode 6 reaches a voltage Va2 lower than the write voltage Va by a fed voltage ΔV2 attributed to the second parasitic capacitance. This voltage Va2 is hereinafter referred to as a second retention voltage. The fed voltage ΔV2 attributed to the second parasitic capacitance is substantially the same as the fed voltage ΔV1 attributed to the first parasitic capacitance. Thus, the value of the second retention voltage Va2 is substantially the same as the value of the first retention voltage Va1.

On the other hand, the first voltage V1 applied to the second capacitive electrode 18a is the same voltage (a voltage the level of which is inverted in each of the selecting periods t1, t2, t3, t4, ... tn for the pixel rows) as the common signal Vcom applied to the common electrode 6. However, the second voltage V2 applied to the third capacitive electrode 18b is a constant-level direct-current voltage different from the first voltage V1.

Thus, if the voltage level of the common signal Vcom is inverted with respect to the voltage level in the selecting period t1 for the first row, the charge voltages of the first pixel capacity $C_{LC}1$, the second compensating capacity Cs2, and the third compensating capacity Cs3 are dropped at rates corresponding to the capacity values of $C_{LC}1$, Cs2, and Cs3 in response to the decrease of the value of the voltage across the common electrode 6 and the third capacitive electrode 18b.

If the voltage level of the common signal Vcom is equal to the voltage level in the selecting period t1 for the first row, the charge voltages of the first pixel capacity $C_{LC}1$ and the second compensating capacity Cs2 and the charge voltage of the third compensating capacity Cs3 respectively reach voltages after the end of writing in the selecting period t1 for the first pixel row (voltages after the second TFT 9b is switched off).

Thus, the voltage across the second pixel electrode 5b and the common electrode 6 reaches a voltage Va3 lower than the second retention voltage Va2 in the selecting periods (the selecting periods in which the voltage level of the common signal Vcom is inverted with respect to the voltage level in the selecting period t1 for the first row) t2, t4, ... of the even pixel rows among the second and following pixel rows. The voltage across the second pixel electrode 5b and the common electrode 6 returns to substantially the same voltage as the second retention voltage Va2 in the selecting periods (the selecting periods in which the voltage level of the common signal Vcom is equal to the voltage level in the selecting period t1 for the first row) t3, t5, ... of the odd pixel rows.

Accordingly, the voltage having a value equal to the average of the voltages Va2 and Va3 alternately applied in the selecting periods t1, t2, t3, ... tn for the pixel rows is applied to the liquid crystal in the second region 30b as an effective voltage for one frame.

In addition, the second retention voltage Va2, and the voltage Va3 lower than the second retention voltage Va2 can be obtained by Equation (1) and Equation (2):

$$Va2 = (C_{lc}+C_2) \times (V_{pix}-V_{comL}) + C_3 \times (V_{pix}-C_3) + C_{ds} \times (V_{pix}-V_{sigH}) + C_{gs} \times (V_{pix}-V_{gL}) \quad (1)$$

$$Va3 = (C_{lc}+C_2) \times (V_{pix}-V_{comH}) + C_2 \times (V_{pix}-C_3) + C_{ds} \times (V_{pix}-V_{sigL}) + C_{gs} \times (V_{pix}-V_{gL}) \quad (2)$$

$C_{lc}$: the capacity value of the second pixel capacity $C_{LC}2$ $C_2$: the capacity value of the second compensating capacity Cs2

$C_3$: the capacity value of the third compensating capacity Cs3

$C_{gs}$: the gate-source capacitance of the second TFT 9b $C_{ds}$: drain-source capacitance of the second TFT 9b $V_{sigH}$: the potential of the data signal in the selecting period for the first pixel row $V_{sigL}$: the potential of the data signal in the selecting period for the second pixel row $V_{gL}$: the off voltage of the scan signal $V_{pix}$: the potential of the second pixel electrode 5b $V_{comL}$: the value of the low-level value of the common signal Vcom ($V1_L$)

$V_{comH}$: the value of the high-level value of the common signal Vcom ($V1_H$)

The one-frame effective voltage applied to the liquid crystal in the second region 30b can be obtained by Equation (3):

$$\text{Effective voltage} = \{(Va2^2+Va3^2)/2\}^{1/2} \quad (3)$$

Thus, the one-frame effective voltage for the second region 30h of each of the pixels 30 is a voltage lower than the one-frame effective voltage for the first region 30a of the same pixel 30. Therefore, even for the gradation data of the same value, the liquid crystal molecules in the second region 30b stand at an angle smaller than the standing angle of the liquid crystal molecules in the first region 30a.

Figure 16:
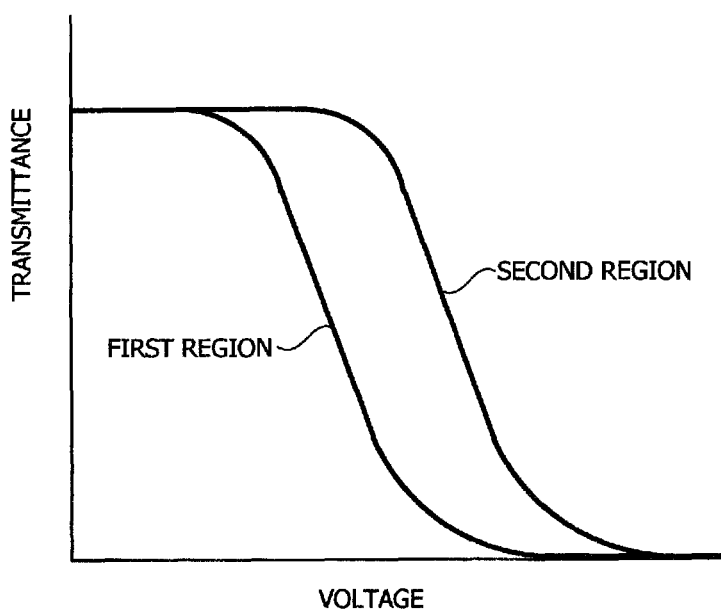
FIG. 16 is a voltage-transmittance characteristic diagram of the liquid crystal layers in the first region and the second region.

As a result, a voltage-transmittance characteristic in the liquid crystal layer 2 of the second region 30b of each of the pixels 30 is different from a voltage-transmittance characteristic in the liquid crystal layer 2 of the first region 30a. FIG. 16 shows the voltage-transmittance characteristics of the first region 30a and the second region 30b in the normally-white-mode liquid crystal display device which provides the brightest display when a voltage applied across the pixel electrode 5 and the common electrode 6 is 0 V. As shown in FIG. 16, the voltage-transmittance characteristic of the second region 30b is a characteristic shifted toward a high voltage side as compared with the voltage-transmittance characteristic of the first region 30a.

Thus, for example, the thickness of the liquid crystal layer 2 (the gap between the first substrate 3 and the second substrate 4) is designed so that the voltage-transmittance characteristic of the first region 30a provides a predetermined viewing angle. Moreover, the value of the second voltage V2 is set so that the voltage-transmittance characteristic of the second region 30b may be a characteristic shifted a predetermined amount as compared with the voltage-transmittance characteristic of the first region 30a, that is, a characteristic that provides a viewing angle different from the viewing angle of the first region 30a. Consequently, a wide viewing angle can be obtained by the synergy of the viewing angle characteristic of the first region 30a and the viewing angle characteristic of the second region 30b.

The viewing angle resulting from the synergy of the viewing angle characteristic of the first region 30a and the viewing angle characteristic of the second region 30b corresponds to the area ratio between the first region 30a and the second region 30b (area ratio between the first pixel electrode 5a and the second pixel electrode 5b). Therefore, a predetermined degree of a viewing angle can be obtained by selecting this area ratio.

Figure 17:
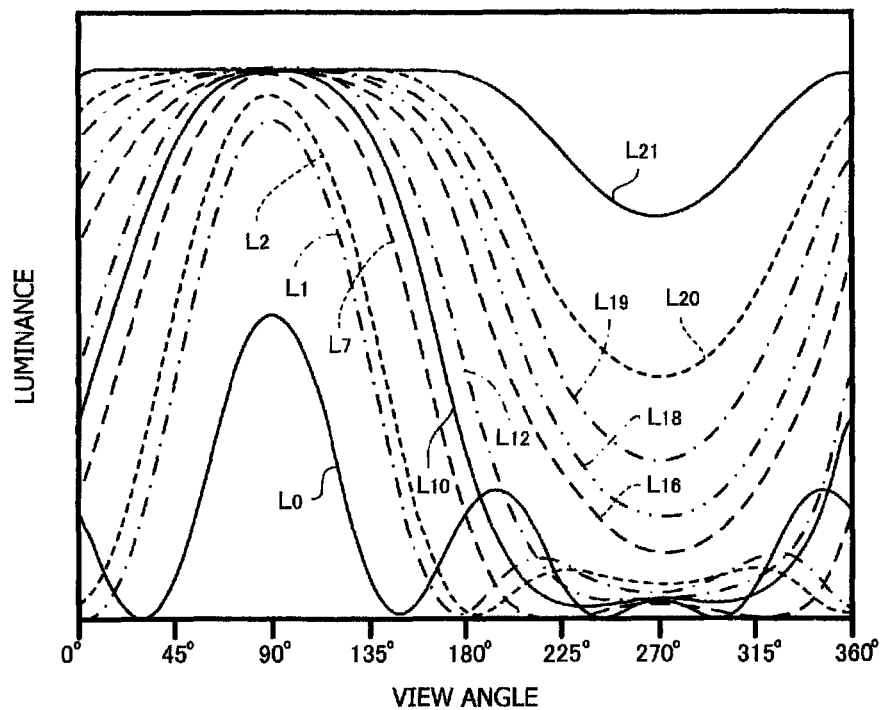
FIG. 17 is a viewing angle-luminance characteristic diagram of a liquid crystal display apparatus according to a first comparative example.
Figure 18:
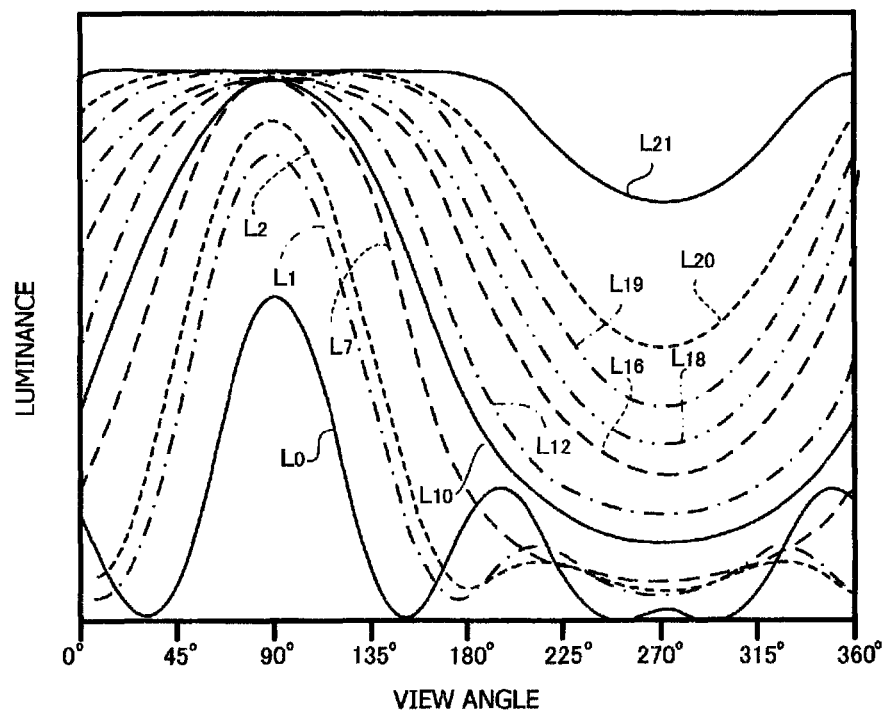
FIG. 18 is a viewing angle-luminance characteristic diagram of the liquid crystal display apparatus according to the first embodiment.

FIG. 17 shows a viewing angle-luminance characteristic of a TN liquid crystal display apparatus according to a first comparative example. This liquid crystal display apparatus is designed so that one pixel electrode is only provided for one pixel, and this pixel electrode is shaped to correspond to the whole area of the pixel, in order to provide the highest contrast when viewed at 6 o'clock. FIG. 18 shows a viewing angle-luminance characteristic of the TN liquid crystal display apparatus as the liquid crystal display apparatus according to the first embodiment (two pixel electrodes are provided for one pixel). This liquid crystal display apparatus is designed so that the area ratio between the first region 30a and the second region 30b of each of the pixels 30 is set at the area of the first region: the area of the second region=7:3 in order to provide the highest contrast when viewed at 6 o'clock. In FIG. 17 and FIG. 18, the viewing angle is a counterclockwise angle with respect to a 0° direction when the viewing angle at 9 o'clock is 0°. The luminance is a luminance in a direction tilted a predetermined angle with respect to the normal to the liquid crystal display device at each viewing angle.

FIG. 17 and FIG. 18 show viewing angle-luminance characteristics when the data signals corresponding to $L_0$, $L_1$, $L_2$, $L_7$, $L_{10}$, $L_{12}$, $L_{16}$, $L_{18}$, $L_{19}$, $L_{20}$, and $L_{21}$ are applied among 22 tones $L_0$ (the value of the darkest tone) to $L_{21}$ (the value of the brightest tone).

As apparent from FIG. 17 and FIG. 18, in the liquid crystal display apparatus according to the embodiment described above, a gradation-luminance characteristic in a direction at 90° (6 o'clock) is kept at substantially the same gradation-luminance characteristic in the liquid crystal display apparatus according to the comparative example, and at the same time, a gradation-luminance characteristic in a direction at 270° (12 o'clock) can be improved as compared with the liquid crystal display apparatus according to the comparative example. That is, lack of gradation and gradation inversion that are caused on the lower side of gradation in the direction at 270° (12 o'clock) in the liquid crystal display apparatus according to the comparative example can be improved in the liquid crystal display apparatus according to the embodiment described above. As a result, a wide viewing angle can be obtained in the liquid crystal display apparatus according to the embodiment described above.

Furthermore, in the liquid crystal display apparatus according to the embodiment described above, the viewing angle can be fine-tuned simply by controlling the value of the voltage applied to the third capacitive electrode 18b. Thus, even if the viewing angle varies among display apparatuses as a result of errors of, for example, the thickness of insulating films or an inter-substrate gap caused in a manufacturing process, the variation of the viewing angle can be easily corrected.

That is, in the liquid crystal display apparatus according to the embodiment described above, the first voltage V1 equal to the voltage applied to the common electrode 6 is applied to the first capacitive electrode 17 and the second capacitive electrode 18a, and the second voltage V2 different from the first voltage V1 is applied to the third capacitive electrode 18b. Thus, the voltage-transmittance characteristic of the second region 30b can be changed by controlling the value of the second voltage V2 applied to the third capacitive electrode 18b.

The voltage-transmittance characteristic of the second region 30b is a characteristic shifted toward a high voltage side as compared with the voltage-transmittance characteristic of the first region 30a, as shown in FIG. 16. The amount of this shift corresponds to the difference between the first voltage V1 applied to the second capacitive electrode 18a and the second voltage V2 applied to the third capacitive electrode 18b.

In this embodiment, the shift amount of the voltage-transmittance characteristic of the second region 30b with respect to the voltage-transmittance characteristic of the first region 30a decreases with the decrease of the difference between the first voltage V1 and the second voltage V2, and increases with the increase of the difference between the first voltage V1 and the second voltage V2.

Thus, in the liquid crystal display apparatus described above, the voltage-transmittance characteristic of the second region 30b can be changed, so that the viewing angle characteristic of the second region 30b can be freely adjusted. Therefore, the viewing angle resulting from the synergy of the viewing angle characteristic of the first region 30a and the viewing angle characteristic of the second region 30b is fine-tuned to a predetermined value, and the variation of the viewing angle among display apparatuses can be corrected. The correction of the variation of the viewing angle can be easily made simply by controlling the second voltage V2 applied to the third capacitive electrode 18b.

Furthermore, in the liquid crystal display apparatus described above, the first capacitive electrode 17 is in a rectangular frame shape that overlaps all the sides of the first pixel electrode 5a, so that the capacity value of the first compensating capacity Cs1 can be sufficiently high.

Still further, in the liquid crystal display apparatus described above, of the second capacitive electrode 18a and the third capacitive electrode 18b, the third capacitive electrode 18b is formed to extend in a direction along predetermined one side of the second pixel electrode 5b and overlap this predetermined side, and the second capacitive electrode 18a is formed to overlap the other sides of the second pixel electrode 5b except for the above-mentioned predetermined side at a distance from the third capacitive electrode 18b. As a result, the capacity value of the second compensating capacity Cs2 can be higher than the capacity value of the third compensating capacity Cs3. Therefore, even if the value of the second voltage V2 applied to the third capacitive electrode 18b slightly varies, the voltage-transmittance characteristic does not vary for no reason in the liquid crystal layer 2 of the second region 30b. Consequently, the voltage-transmittance characteristic can be more finely tuned. Moreover, the voltage-transmittance characteristic in the liquid crystal layer 2 of the second region 30b can be prevented from varying due to the application of a noise voltage to the third capacitive electrode 18b.

Still further, in the embodiment described above, the common signal Vcom applied to the common electrode 6 and the first voltage V1 (Vcom=V1) applied to the first capacitive electrode 17 are rectangular-wave alternating voltages the levels of which are inverted in predetermined periods, for example, rectangular-wave alternating voltages the levels of which are inverted in each of the selecting periods t1, t2, t3, ... tn for the pixel rows in one frame. Thus, a constant-value effective voltage corresponding to the first retention voltage Va1 can be applied to the liquid crystal in the first region 30a of each of the pixels during a period from the end of writing in the setting period t1 for the first row to the end of one frame.

Still further, in the embodiment described above, the first voltage (rectangular-wave alternating voltage) V1 equal to the voltage applied to the common electrode 6 and the first capacitive electrode 17 is applied to the second capacitive electrode 18a, and the second voltage V2 comprising a constant-level direct-current voltage, for example, at a value between the high-level value $V1_H$ and the low-level value $V1_L$ that constitute the first voltage V1 is applied to the third capacitive electrode 18b. Thus, the voltage applied across the second pixel electrode 5b and the common electrode 6 is alternately changed to the second retention voltage Va2 and the voltage Va3 lower than the second retention voltage Va2, as shown in FIG. 15. Accordingly, an effective voltage having a value equal to the average of the two voltages Va2 and Va3 can be alternately applied to the liquid crystal in the second region 30b of each of the pixels 30 during a period from the end of writing in the selecting period t1 for the first row to the end of one frame.

Moreover, this liquid crystal display apparatus comprises the auxiliary electrode 19. In the region between the first pixel electrode 5a of the first pixel 30 and the second electrode 5b of the second pixel 30 of the pixels 30, 30 adjacent in a direction intersecting with the extending direction of the scan signal line 7, the auxiliary electrode 19 is disposed to face the common electrode 6 and to extend in a direction along the neighboring sides of the first pixel electrode 5a and the second pixel electrode 5b. As a result, a voltage can be applied across the auxiliary electrode 19 and the common electrode 6.

Consequently, the liquid crystal display apparatus according to the embodiment described above allows abnormal display caused when a weight is applied to the display surface to be eliminated substantially simultaneously with the removal of the weight, thereby constantly enabling high-quality display.

Figure 19:
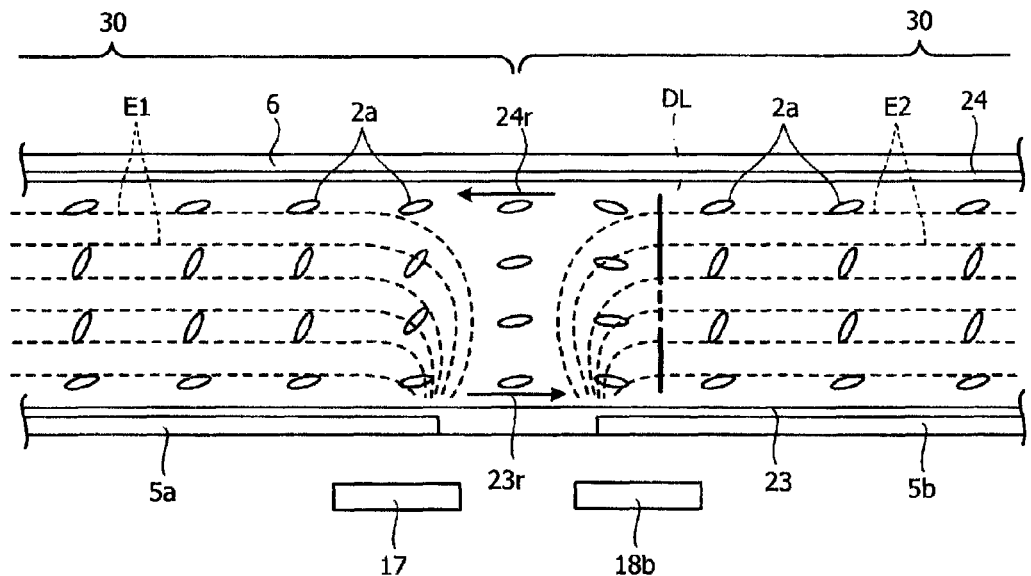
FIG. 19 is a schematic diagram showing the alignment condition of liquid crystal molecules during voltage application in a liquid crystal display apparatus according to a second comparative example.
Figure 20:
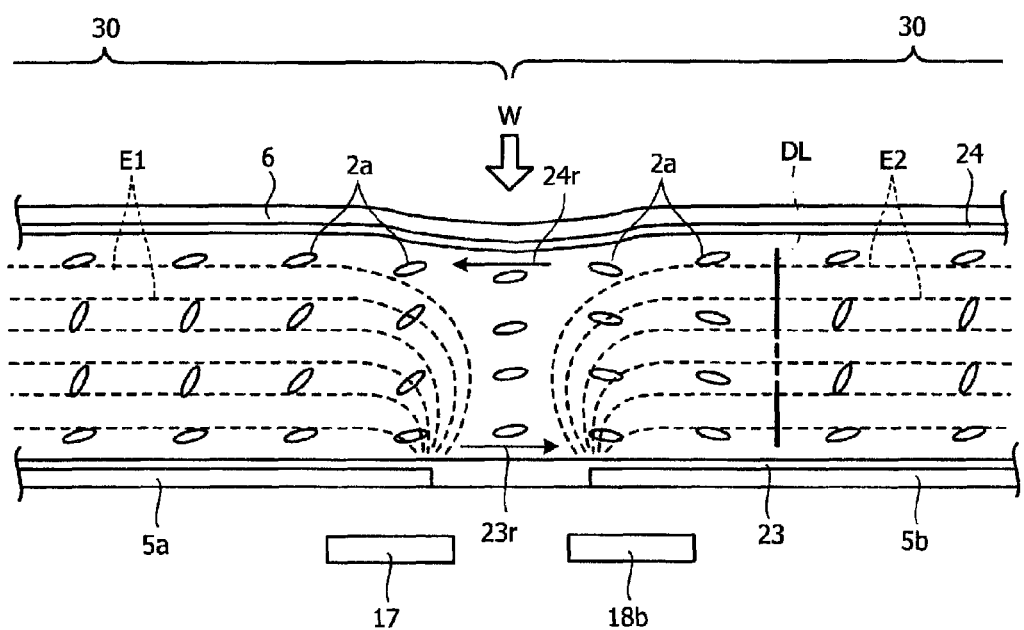
FIG. 20 is a schematic diagram showing the alignment condition of the liquid crystal molecules when a weight is applied to a display surface in the liquid crystal display apparatus according to the second comparative example.
Figure 21:
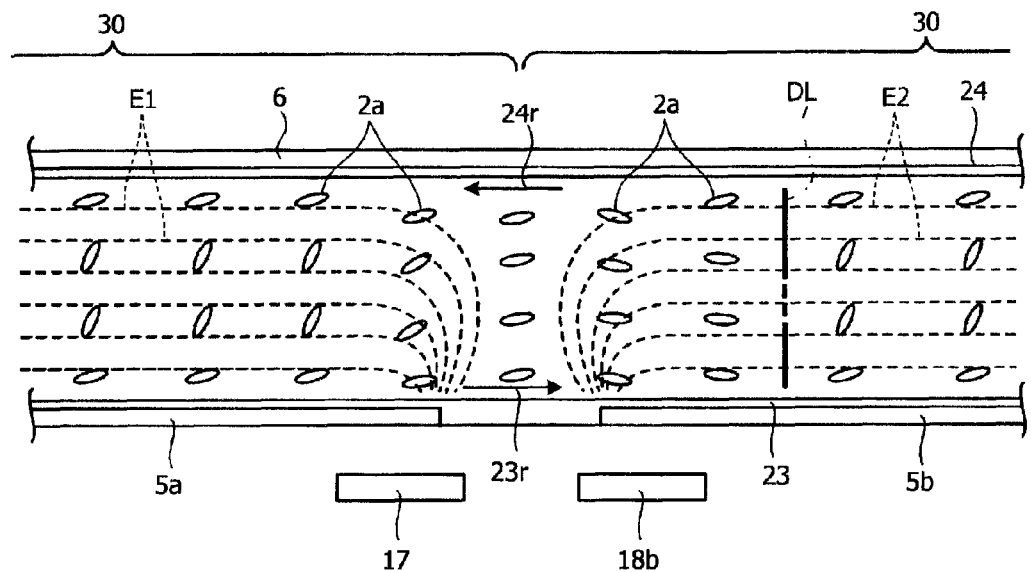
FIG. 21 is a schematic diagram showing the alignment condition of the liquid crystal molecules after the removal of the weight in the liquid crystal display apparatus according to the second comparative example.
Figure 22:
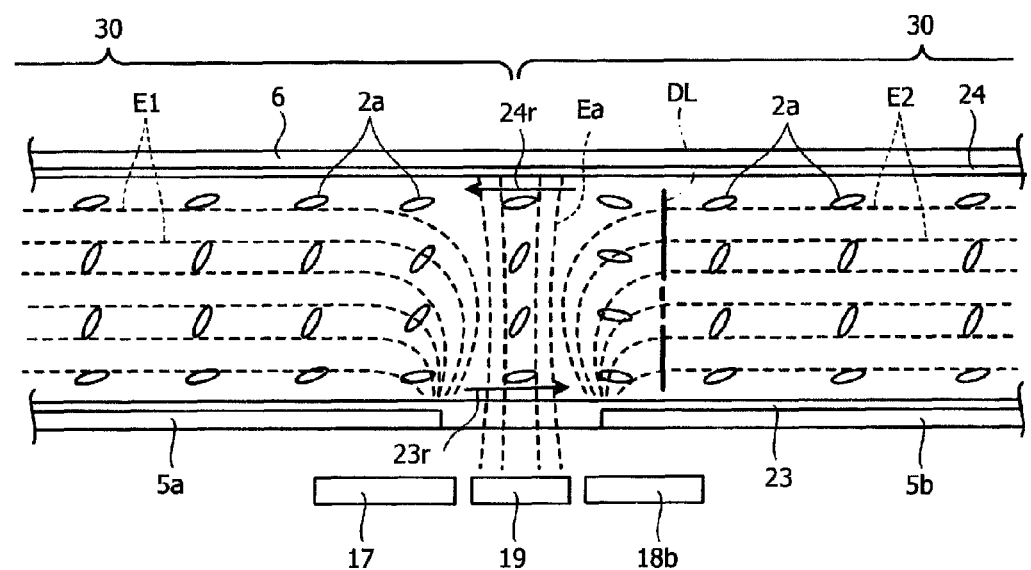
FIG. 22 is a schematic diagram showing the alignment condition of the liquid crystal molecules during voltage application in the liquid crystal display apparatus according to the first embodiment.

FIG. 19 to FIG. 21 are schematic diagrams showing the alignment condition of liquid crystal molecules 2a in a liquid crystal display apparatus according to a second comparative example which is not provided with the auxiliary electrode 19. FIG. 22 is a schematic diagram showing the alignment condition of the liquid crystal molecules 2a in the liquid crystal display apparatus according to the embodiment described above. Each of the diagrams shows the alignment condition of the liquid crystal molecules 2a in the part in which two pixels 30, 30 adjoin each other in a direction intersecting with the extending direction of the scan signal line 7.

The liquid crystal display apparatus according to the second comparative example is not provided with the auxiliary electrode 19, but in other respects, has the same configuration as the liquid crystal display apparatus according to the embodiment described above. In addition, the liquid crystal display apparatus according to the embodiment described above and the liquid crystal display apparatus according to the second comparative example are TN liquid crystal display apparatuses. FIG. 19 to FIG. 21 and FIG. 22 show the alignment conditions of the liquid crystal molecules 2a in a non-twist homogeneous alignment type in which the first alignment film 23 and the second alignment film 24 are rubbed in the parallel and opposite directions so that the tilt directions of the liquid crystal molecules 2a can be easily recognized.

As the liquid crystal display apparatus according to the second comparative example is not provided with the auxiliary electrode 19, there is always no electric field between the common electrode 6 and the region which is located between the first pixel electrode 5a of the first pixel 30 and the second pixel electrode 5b of the second pixel 30 adjacent to each other.

When a voltage is applied across the first and second pixel electrodes 5a and 5b and the common electrode 6, driving electric fields are generated between the first pixel electrode 5a and the common electrode 6 and between the second pixel electrode 5b and the common electrode 6. In response to the driving electric fields, the liquid crystal molecules 2a are aligned to stand on the surfaces of the substrates 3 and 4.

The driving electric fields are electric fields which are distorted diagonally to the normal to the substrates 3 and 4 in the vicinity of the side of the first pixel electrode 5a and in the vicinity of the side of the second pixel electrode 5b as a result of a lateral electric field generated between the edges of the adjacent pixel electrodes 5a and 5b. That is, the driving electric field generated between the first pixel electrode 5a and the common electrode 6 is an electric field having a potential distribution shown by isoelectric lines E1 in FIG. 19. The driving electric field generated between the second pixel electrode 5b and the common electrode 6 is an electric field having a potential distribution shown by isoelectric lines E2 in FIG. 19.

Thus, in the vicinity of the side of the pixel electrode located on the upstream side of the rubbing direction 23r of the first alignment film 23 and on the downstream side of the rubbing direction 24r of the second alignment film 24 of the neighboring sides of the first pixel electrode 5a and the second pixel electrode 5b, the liquid crystal molecules 2a stand to be tilted in a direction opposite to the pretilt direction determined by the rubbing directions 23r and 24r of the first alignment film 23 and the second alignment film 24. Disclination is caused in this part.

For example, when the rubbing directions 23r and 24r of the first alignment film 23 and the second alignment film 24 are as shown in FIG. 19, the liquid crystal molecules 2a present in the vicinity of the left side of the second pixel electrode 5b located in the right side of the diagram stand to be tilted in a direction opposite to the pretilt direction and cause disclination. When the rubbing directions 23r and 24r of the first alignment film 23 and the second alignment film 24 are opposite to the directions shown in FIG. 19, the liquid crystal molecules 2a present in the vicinity of the right side of the first pixel electrode 5a located in the left side of the diagram stand to be tilted in a direction opposite to the pretilt direction and cause disclination.

The boundary between the region where the liquid crystal molecules 2a are tilted forward in the pretilt direction and the region where the liquid crystal molecules 2a are tilted opposite to the pretilt direction is called a disclination line. This disclination line DL is mostly generated at a position hidden by the light-shielding film 22 provided in the second substrate 4. Therefore, the generation of the disclination is invisible ram the outside.

However, if a weight partly applied to the display surface of liquid crystal display apparatus by, for example, fingertip pressing and the second substrate 4 is bent and deformed by the weight W as shown in FIG. 20, the part where the disclination is caused is pressed and expanded so that the disclination line DL is brought into the opening of the right pixel 30 and causes abnormal display.

In the liquid crystal display apparatus according to the second comparative example, the alignment condition of liquid crystal molecules 2a is not immediately restored to the condition shown in FIG. 19 even if the weight W applied to the display surface is removed and the second substrate 4 is restored to the flat state shown in FIG. 21. Thus, the abnormal display caused by the disclination is visible for a certain period of time.

The liquid crystal display apparatus according to the embodiment described above is provided with the auxiliary electrode 19 in contrast with the liquid crystal display apparatus according to the second comparative example. Thus, an auxiliary voltage is applied to the auxiliary electrode 19 to generate an electric field between the auxiliary electrode 19 and the common electrode 6, so that the liquid crystal molecules 2a in the part corresponding to the region between the first pixel electrode 5a of the pixel 30 and the second pixel electrode 5b of the second pixel 30 adjacent to each other can be aligned to stand on the surfaces of the substrate 3 and 4.

The electric field generated between the auxiliary electrode 19 and the common electrode 6 is preferably stronger than the driving electric fields generated between the first pixel electrode 5a and the common electrode 6 and between the second pixel electrode 5b and the common electrode 6. That is, the potential difference between the auxiliary electrode 19 and the common electrode 6 is preferably set to be greater than the potential difference between the first pixel electrode 5a and the common electrode 6 and greater than the potential difference between the second pixel electrode 5b and the common electrode 6. Such a condition is preferably maintained regardless of whether a gradation voltage written into the first pixel electrode 5a and the second pixel electrode 5b.

Thus, in the liquid crystal display apparatus according to the embodiment described above, an auxiliary voltage higher than a voltage corresponding to the gradation data whereby the voltage applied to the liquid crystal layer 2 is maximized is applied to the auxiliary electrode 19 by the driving unit 31.

As such an auxiliary voltage, the gate off voltage which switches off the first and second thin film transistors 9a and 9b or the gate on voltage which switches on the first and second thin film transistors 9a and 9b can be used among the scan signals applied to the scan signal line 7.

For example, when the gate off voltage is used as the auxiliary voltage, the output terminal of the scan signal power source 38 corresponding to the gate off voltage $Vg_L$ is connected to the auxiliary voltage input terminal 29c formed in the driver mounting portion 3a of the liquid crystal display device 1. Under the control of the control unit 37, the gate off voltage $Vg_L$ is continuously output to the auxiliary voltage input terminal 29c from the scan signal power source 38 while the liquid crystal display device 1 is being driven.

The gate off voltage $Vg_L$ is a voltage which has a negative polarity with respect to the central potential of the amplitude of the common signal Vcom (=V1) applied to the common electrode 6, and the potential difference between the gate off voltage $Vg_L$ and the central potential is 10 to 15 V. The amplitude of the common signal Vcom (the difference between the high-level value $V1_H$ and the low-level value $V1_L$) is about 5 V±1 V. Therefore, the potential difference between the gate off voltage $Vg_L$ and the high-level value $V1_H$ as well as the low-level value $V1_L$ of the common signal Vcom is 7 V or more. Thus, the gate off voltage $Vg_L$ is preferable as a voltage for applying, to the auxiliary electrode 19, the auxiliary voltage higher than a voltage corresponding to the gradation data whereby the voltage applied to the liquid crystal layer 2 is maximized.

The gate on voltage $Vg_H$ is a voltage which has a positive polarity with respect to the central potential of the amplitude of the common signal Vcom (=V1) applied to the common electrode 6, and the potential difference between the gate off voltage $Vg_H$ and the central potential is 10 to 15 V. The amplitude of the common signal Vcom (the difference between the high-level value $V1_H$ and the low-level value $V1_L$) is about 5 V±1 V. Therefore, the potential difference between the gate on voltage $Vg_H$ and the high-level value $V1_H$ as well as the low-level value $V1_L$ of the common signal Vcom is 7 V or more. Thus, the gate on voltage $Vg_H$ is also preferable as a voltage for applying, to the auxiliary electrode 19, the auxiliary voltage higher than a voltage corresponding to the gradation data whereby the voltage applied to the liquid crystal layer 2 is maximized.

Here, the behavior of the disclination caused in the liquid crystal display apparatus according to the embodiment described above having the auxiliary electrode 19 is described.

In the liquid crystal display apparatus according to the embodiment described above as well, a driving electric field rated between the first electrode 5a and the common electrode 6 is an electric field having a potential distribution shown isoelectric lines E1 in FIG. 22. A driving electric field generated between the second pixel electrode 5b and the common electrode 6 is an electric field having a potential distribution shown by isoelectric lines E2 in FIG. 22.

Thus, in the vicinity of the side of the pixel electrode located on the upstream side of the rubbing direction 23r of the first alignment film 23 and on the downstream side of the rubbing direction 24r of the second alignment film 24 (in the vicinity of the left side of the second pixel electrode 5b located in the right side in FIG. 22) of the neighboring sides of the first pixel electrode 5a and the second pixel electrode 5b, the liquid crystal molecules 2a stand to be tilted in a direction opposite to the pretilt direction determined by the rubbing directions 23r and 24r of the first alignment film 23 and the second alignment film 24. Disclination is caused in this part.

If a weight W is partly applied to the display surface of the liquid crystal display apparatus, the part where the disclination is caused is pressed and expanded so that the disclination line DL is brought into the opening of the right pixel 30 and causes abnormal display.

However, the liquid crystal display apparatus according to the embodiment described above, a strong electric field Ea is always generated between the common electrode 6 and the auxiliary electrode 19 which is located in the region between the first pixel electrode 5a of the first pixel 30 and the second pixel electrode 5b of the second pixel 30 adjacent to each other. Thus, if the weight W applied to the display surface is removed, the liquid crystal molecules 2a in the region between the first pixel electrode 5a and the second pixel electrode 5b are immediately aligned to stand by the electric field Ea. Accordingly, the alignment condition of liquid crystal molecules 2a is restored to the condition shown in FIG. 22.

Consequently, according to the liquid crystal display apparatus of the embodiment described above, abnormal display caused when a weight is applied to the display surface can be eliminated substantially simultaneously with the removal of the weight, thereby constantly enabling high-quality display.

In addition, the alignment conditions of the liquid crystal molecules 2a in the nontwist homogeneous alignment type are shown in FIG. 19 to FIG. 21 and FIG. 22. However, in the TN liquid crystal display apparatus in which the first alignment film 23 and the second alignment film 24 are rubbed in directions perpendicular to each other at an angle of 45° with the lateral axis of the screen area 1a, disclination is caused in the vicinity of the side of the second pixel electrode 5b of the neighboring sides of the first pixel electrode 5a of the first pixel 30 and the second pixel electrode 5b of the second pixel 30 that are adjacent to each other when the rubbing directions 23r and 24r of the first alignment film 23 and the second alignment film 24 are as shown in FIG. 5 and FIG. 10. When the rubbing directions 23r and 24r of the first alignment film. 23 and the second alignment film 24 are opposite to the directions shown in FIG. 5 and FIG. 10, disclination is caused in the vicinity of the side of the first pixel electrode 5a.

However, in the liquid crystal display apparatus according to the embodiment described above, the auxiliary electrode 19 is located in the region between the first pixel electrode 5a of the first pixel 30 and the second pixel electrode 5b of the second pixel 30 adjacent to each other. Therefore, even if the disclination is caused in the vicinity of the side of the second pixel electrode 5b or in the vicinity of the side of the first pixel electrode 5a, abnormal display caused when a weight is applied to the display surface can be eliminated substantially simultaneously with the removal of the weight.

Furthermore, in the embodiment described above, the gate off voltage or the gate on voltage is applied the auxiliary electrode 19 as the auxiliary voltage. Therefore, there is no need to newly generate the auxiliary voltage having a different value from other voltages. As a result, the driving unit 31 can be simpler as shown in FIG. 1.

Moreover, in the embodiment described above, the auxiliary electrode 19 is in a linear shape smaller in width than the distance between the first pixel electrode 5a of the first pixel 30 and the second pixel electrode 5b of the second pixel 30 adjacent to each other. The auxiliary electrode 19 is disposed so that the distance between the auxiliary electrode 19 and the first pixel electrode 5a is equal to the distance between the auxiliary electrode 19 and the second pixel electrode 5b. Thus, the capacity generated between the auxiliary electrode 19 and the first pixel electrode 5a is equal to the capacity generated between the auxiliary electrode 19 and the second pixel electrode 5b.

Thus, even if capacities are generated between the auxiliary electrode 19 and the first pixel electrode 5a and between the auxiliary electrode 19 and the second pixel electrode 5b, these capacities do not affect the advantage of a wider viewing angle permitted by the provision of the first compensating capacity Cs1 in the first pixel electrode 5a and the provision of the second compensating capacity Cs2 and the third compensating capacity Cs3 in the second pixel electrode 5b.

Meanwhile, when attention is focused on the two pixels 30, 30 adjacent in a direction along the data signal line 8, the liquid crystal display apparatus according to the embodiment described above can be expressed, for example, as follows:

A liquid crystal display apparatus comprises: an auxiliary electrode 19 located between adjacent two scan signal lines 7, 7; a first thin film transistor 9a with a gate electrode 10 connected to one of the two scan signal lines 7, 7; a second thin film transistor 9b with a gate electrode 10 connected to the other of the two scan signal lines 7, 7; a first pixel electrode 5a connected to one of a source electrode 15 and a drain electrode 16 of the first thin film transistor 9a; a second pixel electrode 5b connected to one of a source electrode 15 and a drain electrode 16 of the second thin film transistor 9b; a data signal line 8 that is connected to the other of the source electrode 15 and the drain electrode 16 of the first thin film transistor 9a and that is connected to the other of the source electrode 15 and the drain electrode 16 of the second thin film transistor 9b; and a common electrode 6 disposed to face the first pixel electrode 5a and the second pixel electrode 5b through a liquid crystal layer 2. The first pixel electrode 5a and the second pixel electrode 5b are adjacently located along trio data signal line 8. The auxiliary electrode 19 is set so that a potential difference between the auxiliary electrode 19 and the common electrode 6 is greater than a potential difference between the first pixel electrode 5a and the common electrode 6 and greater than a potential difference between the second pixel electrode 5b and the common electrode 6.

The liquid crystal display apparatus according to the embodiment described above can also be expressed, for example, as follows:

A liquid crystal display apparatus comprises: an auxiliary electrode 19 located between adjacent two scan signal lines 7, 7; a first thin film transistor 9a with a gate electrode 10 connected to one of the two scan signal lines 7, 7; a second thin film transistor 9b with a gate electrode 10 connected to the other of the two scan signal lines 7, 7; a first pixel electrode 5a connected to one of a source electrode 15 and a drain electrode 16 of the first thin film transistor 9a; a second pixel electrode 5b connected to one source electrode 15 and a drain electrode 16 of the second thin film transistor 9b; and a data signal line 8 that is connected to the other of the source electrode 15 and the drain electrode 16 of the first thin film transistor 9a and that is connected to the other of the source electrode 15 and the drain electrode 16 of the second film transistor 9b. The first pixel electrode 5a and the second pixel electrode 5b are adjacently located along the data signal line 8. The auxiliary electrode 19 is located between the first pixel electrode 5a and the second pixel electrode 5b, and is set to a voltage equal to a gate on voltage $Vg_H$ or a gate off voltage $Vg_L$ supplied to the scan signal line 7.

The liquid crystal display apparatus according to the embodiment described above can also be expressed, for example, as follows:

A liquid crystal display apparatus comprises: a first pixel 30 and a second pixel 30 adjacently located along a data signal line 8; and an auxiliary electrode 19 located between the first pixel 30 and the second pixel 30. The first pixel 30 comprises two pixel electrodes 5a and 5b connected to a first scan signal line 7 through different thin film transistors 9a and 9b, and the two pixel electrodes 5a and 5b in the first pixel 30 are disposed so that the first scan signal line 7 intervenes therebetween. The second pixel 30 comprises two pixel electrodes 5a and 5b connected to a second scan signal line 7 through different thin film transistors 9a and 9b, and the two pixel electrodes 5a and 5b in the second pixel 30 are disposed so that the second scan signal line 7 intervenes therebetween. The auxiliary electrode 19 is provided to extend parallel to the first scan signal line 7 and the second scan signal line 7. Moreover, the auxiliary electrode 19 is set to a voltage equal to a gate on voltage $Vg_H$ or a gate off voltage $Vg_L$ supplied to the scan signal line 7.

The liquid crystal display apparatus according to the embodiment described above can also be expressed, for example, as follows:

A liquid crystal display apparatus comprises: a first pixel 30 and a second pixel 30 adjacently located along a data signal line 8; and an auxiliary electrode 19 located between the first pixel 30 and the second pixel 30. The first pixel 30 comprises two pixel electrodes 5a and 5b connected to a first scan signal line 7 through different thin film transistors 9a and 9b, and the two pixel electrodes 5a and 5b in the first pixel 30 are disposed so that the first scan signal line 7 intervenes therebetween. The second pixel 30 comprises two pixel electrodes 3a and 5b connected to a second scan signal line 7 through different thin film transistors 9a and 9b, and the two pixel electrodes 5a and 5b in the second pixel 30 are disposed so that the second scan signal line 7 intervenes therebetween. The auxiliary electrode 19 is provided to extend parallel to the first scan signal line 7 and the second scan signal line 7. Moreover, the auxiliary electrode 19 is set that a potential difference between the auxiliary electrode 19 and a common electrode 6 is greater than a potential difference between the two pixel electrodes 5a and 5b in the first pixel 30 and the common electrode 6 and greater than a potential difference between the two pixel electrodes 5a and 5b in the second pixel 30 and the common electrode 6.

Furthermore, the embodiment described above provides a structure having a wide viewing angle, and allows abnormal display resulting from disclination caused when a weight is applied to the display surface to be eliminated substantially simultaneously with the removal of the weight.

Second Embodiment

Figure 23:
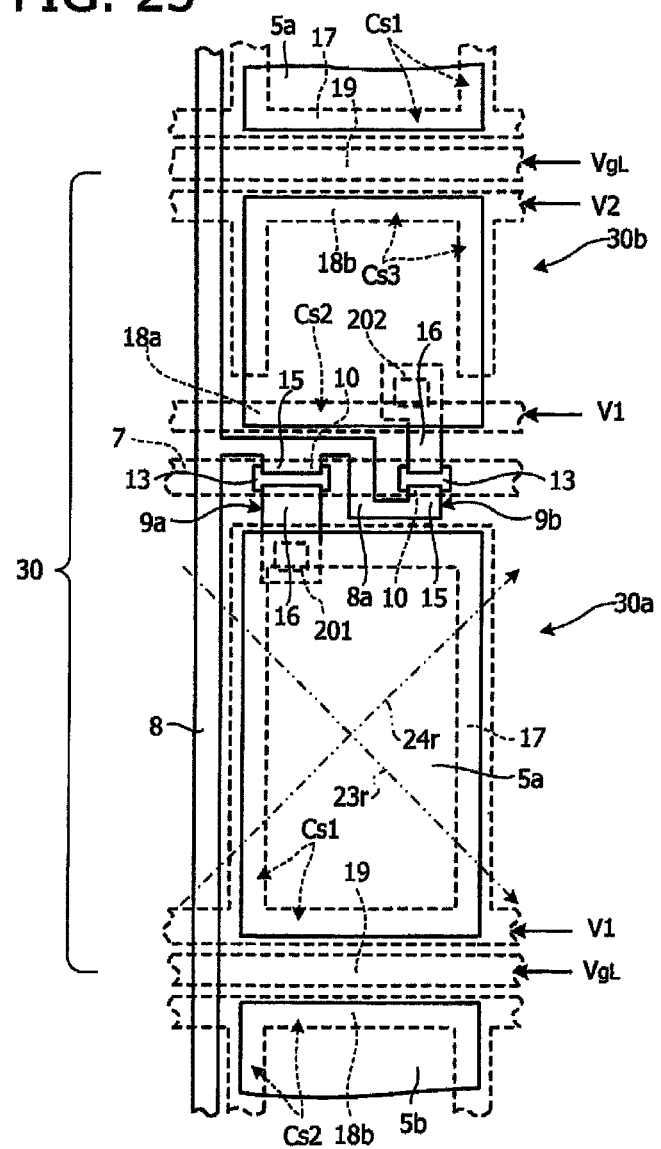
FIG. 23 is a partially enlarged plan view of a first substrate of a liquid crystal display device according to a second embodiment of this invention (a coating insulating film and an alignment film are not shown)

In a liquid crystal display apparatus according to a second embodiment shown in FIG. 23, a second capacitive electrode 18a is formed to be in a linear shape that overlaps one of two lateral sides of a second pixel electrode 5b (a lateral side adjacent to a second scan signal line 7 in FIG. 23). A third capacitive electrode 18b is formed, at a distance from the second capacitive electrode 18a, to be in a three-way frame shape that overlaps the other sides of the second pixel electrode 5b (a lateral side opposite to the side adjacent to the second scan signal line 7 and two longitudinal sides in FIG. 23). In other respects, the configuration is the same as that in the first embodiment.

The liquid crystal display apparatus according to the second embodiment allows the capacity value of a third compensating capacity Cs3 to be higher than the capacity value of a second compensating capacity Cs2. Thus, the voltage-transmittance characteristic in a liquid crystal layer 2 of a second region 30b can be greatly varied simply by slightly varying the voltage of the third capacitive electrode 18b. Therefore, a viewing angle can be adjusted to a great degree. This is particularly advantageous when there is a great variation of the thickness of liquid crystal layers 2 among manufactured liquid crystal display apparatuses.

The second embodiment also allows a viewing angle variation to be easily corrected, and allows abnormal display caused when a weight is applied to a display surface to be eliminated substantially simultaneously with the removal of the weight, thereby constantly enabling high-quality display.

Moreover, in the second embodiment as well, a auxiliary electrode 19 is provided in a region between a first pixel electrode 5a of a first pixel 30 and a second pixel electrode 5b of a second pixel 30 of pixels 30, 30 adjacent in a direction that intersects with the extending direction of the scan signal line 7. The auxiliary electrode 19 is disposed to face a common electrode 6 and to extend in a direction along the neighboring sides of a first pixel electrode 5a and a second pixel electrode 5b. Consequently, as in the first embodiment, abnormal display caused when a weight is applied to the display surface can be eliminated substantially simultaneously with the removal of the weight by applying an auxiliary voltage to the auxiliary electrode 19, thereby constantly enabling high-quality display.

Third Embodiment

Figure 24:
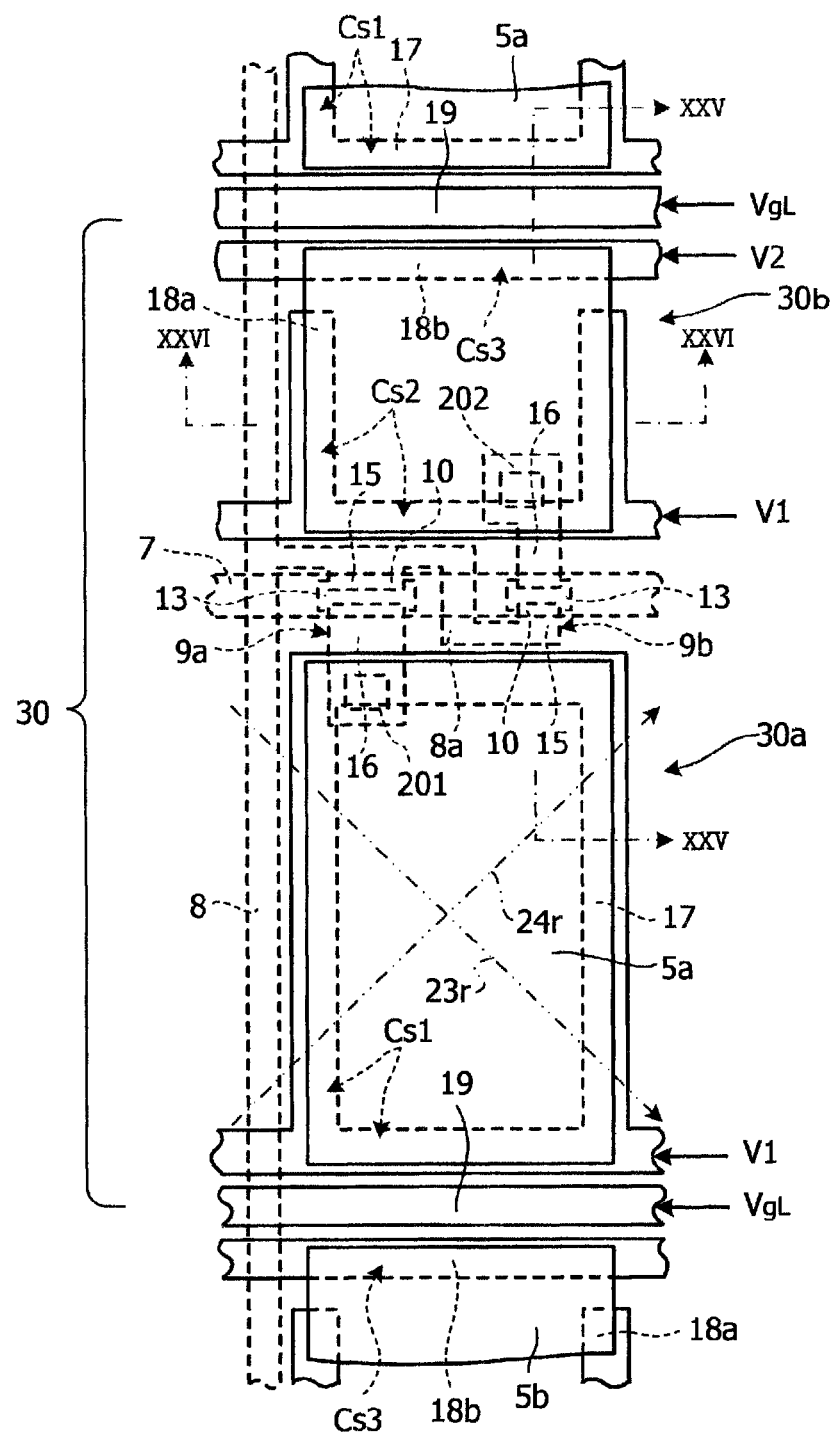
FIG. 24 is a partially enlarged plan view of a first substrate of a liquid crystal display device according to a third embodiment of this invention (a coating insulating film and an alignment film are not shown)
Figure 25:
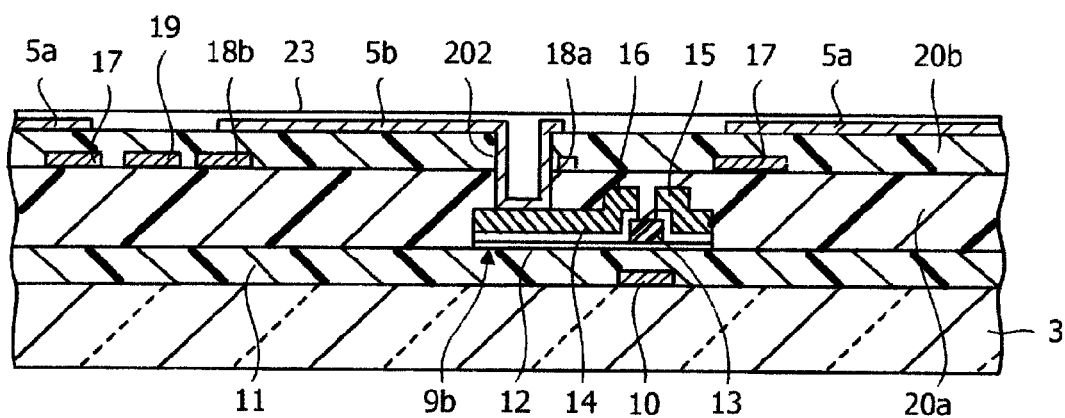
FIG. 25 is an enlarged sectional view along the line XXV-XXV of FIG. 24.
Figure 26:
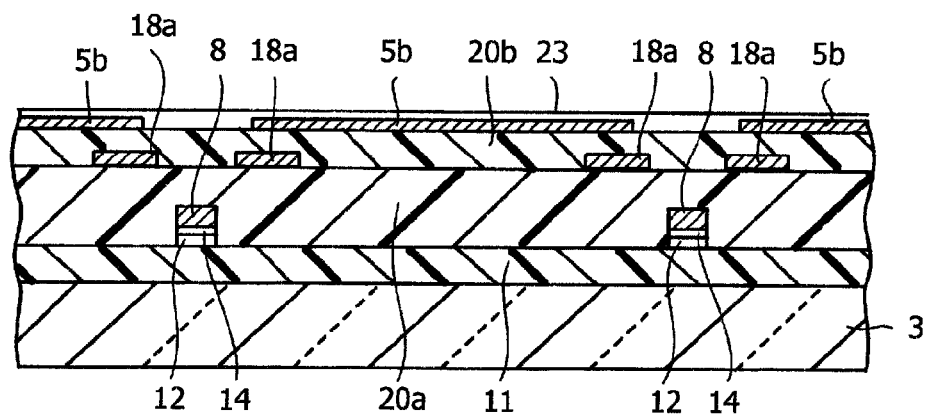
FIG. 26 is an enlarged sectional view along the line XXVI-XXVI of FIG. 24.

A third embodiment of this invention is described next with reference to FIG. 24 to FIG. 26. In the third embodiment, components equivalent to those in the first embodiment are provided with the same reference marks and are not described.

In the third embodiment, a first TFT 9a and a second TFT 9b are formed by the same stacked films as those in the first embodiment. Each of scan signal lines 7 is formed on a first substrate 3, and covered by gate insulating films 11 of the first TFT 9a and the second TFT 9b. Each of data signal lines 8 is formed on the gate insulating film 11. In the third embodiment as well, each of data signal lines 8 is formed on a foundation layer comprising a semiconductor thin film 12 and a contact layer 14 among stacked films that constitute the first TFT 9a and the second TFT 9b.

On the other hand, first, second and third capacitive electrodes 17, 18a, and 18b are in the same shapes (the same shapes in FIG. 5) as those in the first embodiment and formed on a transparent, first coating insulating film 20a which is provided on the gate insulating film 11 to cover the TFTs 9a and 9b and each of data signal lines 8.

Furthermore, a first pixel electrode 5a and a second pixel electrode 5b are formed on a second coating insulating film 20b to be connected to a drain electrode 16 of the first TFT 9a and a drain electrode 16 of the second. TFT 9b through first and second contact holes 201 and 202 provided in the first coating insulating film 20a and the second coating insulating film 20b. The second coating insulating film 20b is provided on the first coating insulating film 20a to cover the capacitive electrodes 17, 18a, and 18b.

That is, in the third embodiment, a first dielectric layer between the first pixel electrode 5a and a first capacitive electrode 17, a second dielectric layer between the second pixel electrode 5b and the second capacitive electrode 18a, and a third dielectric layer between the second pixel electrode 5b and the third capacitive electrode 18b comprise the second coating insulating film 20b, respectively.

In the third embodiment, the parts of the capacitive electrodes 17, 18a, and 18b located in the vicinity of the contact holes are formed to be sufficiently apart from the contact holes 201 and 202 so that no short circuit may be caused between the first and second pixel electrodes 5a and 5b and the capacitive electrodes 17, 18a, and 18b in parts where the pixel electrodes 5a and 5b are put in the contact holes 201 and 202 (parts where the first and second TFTs 9a and 9b are connected to the drain electrode 16).

Furthermore, an auxiliary electrode 19 is provided on the first coating insulating film 20a in a region between the first pixel electrode 5a of a first pixel 30 and the second pixel electrode 5b of a second pixel 30 of pixels 30, 30 adjacent in a direction that intersects with the extending direction of the scan signal line 7. The auxiliary electrode 19 is formed to face a common electrode 6 and to extend in a direction along the neighboring sides of the first pixel electrode 5a and the second pixel electrode.

As in the first and second embodiments described above, the auxiliary electrode 19 is in a linear shape smaller in width than the distance between the first pixel electrode 5a of the first pixel 30 and the second pixel electrode 5b of the second pixel 30 adjacent to each other. The auxiliary electrode 19 is disposed so that the distance between the auxiliary electrode 19 and the first pixel electrode 5a is equal to the distance between the auxiliary electrode 19 and the second pixel electrode 5b. Moreover, the auxiliary electrodes 19 are connected together by seamlessly forming the ends of to neighboring auxiliary electrodes 19, 19 in each row.

In the liquid display apparatus according to the third embodiment as well, a first voltage V1 equal to the voltage applied the common electrode 6 is applied to the first capacitive electrode 17 and the second capacitive electrode 18a, and a second voltage V2 different from the first voltage V1 is applied to the third capacitive electrode 18b. Thus, as in the first embodiment, a viewing angle variation can be easily corrected, and abnormal display caused when a weight is applied to a display surface can be eliminated substantially simultaneously with the removal of the weight, thereby constantly enabling high-quality display.

Furthermore, the auxiliary electrode 19 is provided in the third embodiment as well. Consequently as in the first embodiment, abnormal display caused when a weight is applied to the display surface can be eliminated substantially simultaneously with the removal of the weight by applying an auxiliary voltage to the auxiliary electrode 19, thereby constantly enabling high-quality display.

Fourth Embodiment

Figure 27:
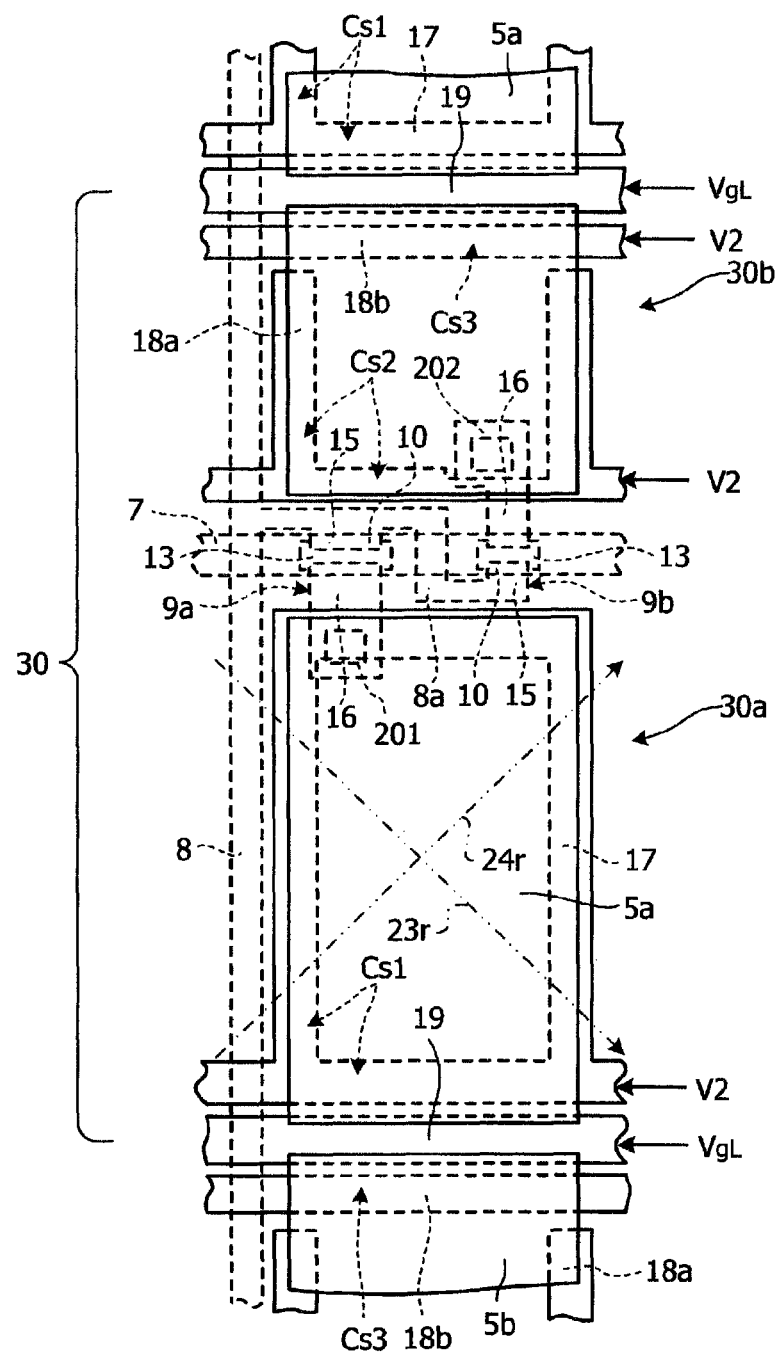
FIG. 27 is a partially enlarged plan view of a first substrate of a liquid crystal display device according to a fourth embodiment of this invention (a coating insulating film and an alignment film are not shown).

In a fourth embodiment shown in FIG. 27, the auxiliary electrode 19 in the liquid crystal display apparatus according to the third embodiment is shaped to have a width extending all over the distance between a first pixel electrode 5a of a first pixel 30 and a second pixel electrode 5b of a second pixel 30 of pixels 30, 30 adjacent in a direction that intersects with the extending direct 1 of the scan signal line 7. In other respects, the configuration is the same as that in the third embodiment.

In the fourth embodiment, the auxiliary electrode 19 is shaped to have such a width that both edges thereof slightly overlap the first pixel electrode 5a and the second pixel electrode 5b, respectively. The width overlapping the first pixel electrode 5a and the width overlapping the second pixel electrode 5b are located to be equal.

Moreover, in the fourth embodiment, a first capacitive electrode 17, and a third capacitive electrode 18b adjacent to the auxiliary electrode 19 of the second and third capacitive electrodes 18a and 18b are shaped so that their sides adjacent to the auxiliary electrode 19 are located slightly deeper into the pixel electrodes 5a and 5b than the outer edges of the first pixel electrode 5a and the second pixel electrode 5b. The auxiliary electrode 19 is located at a distance between the first capacitive electrode 17 and the third capacitive electrode 18b.

In the liquid crystal display apparatus according to the fourth embodiment as well, a first voltage V1 equal to the voltage applied to a common electrode 6 is applied to the first capacitive electrode 17 and the second capacitive electrode 18a, and a second voltage V2 different from the first voltage V1 is applied to the third capacitive electrode 18b. Thus, as in the first embodiment, a viewing angle variation can be easily corrected, and abnormal display caused when a weight is applied to a display surface can be eliminated substantially simultaneously with the removal of the weight, thereby constantly enabling high-quality display.

Furthermore, the auxiliary electrode 19 is provided in the fourth embodiment as well. Consequently, as in the first embodiment, abnormal display caused when a weight is applied to the display surface can be eliminated substantially simultaneously with the removal of the weight by applying an auxiliary voltage to the auxiliary electrode 19, thereby constantly enabling high-quality display.

Moreover, in the fourth embodiment, the auxiliary electrode 19 is disposed so that the width overlapping the first pixel electrode 5a is equal to the width overlapping the second pixel electrode 5b. Thus, the capacity generated between the auxiliary electrode 19 and the first pixel electrode 5a is equal to the capacity generated between the auxiliary electrode 19 and the second pixel electrode 5b. Therefore, even if capacities are generated between the auxiliary electrode 19 and the first pixel electrode 5a and between the auxiliary electrode 19 and the second pixel electrode 5b, these capacities not affect the advantage of a wider viewing angle permitted by the provision of a first compensating capacity Cs1 in the first pixel electrode 5a and the provision of a second compensating capacity Cs2 and a third compensating capacity Cs3 in the second pixel electrode 5b.

Other Embodiments

In the embodiments described above, the second voltage V2 comprising a constant-level direct-current voltage is applied to the third capacitive electrode 18b. However, the second voltage applied to the third capacitive electrode 18b may be any other voltage as long as such a voltage is different in value from the first voltage (the voltage equal to the voltage applied to the common electrode 6) V1 applied to the first capacitive electrode 17 and the second capacitive electrode 18a.

In this case, the second voltage may be a rectangular-wave alternating voltage the level of which is inverted at the same periods as the first voltage V1 and the amplitude of which is lower than the amplitude of the first voltage V1. The second voltage V2 may be a rectangular-wave alternating voltage in phase with the first voltage V1 or a rectangular-wave alternating voltage having a phase opposite to that of the first voltage V1.

Furthermore, in the embodiments described above, the direct-current voltage having a value that switches off the first and second thin film transistors 9a and 9b is applied to the auxiliary electrode 19 as an auxiliary voltage among the scan signals applied to the scan signal line 7. However, the auxiliary voltage may be any other voltage as long as the potential difference between such a voltage and the common electrode 6 is greater than a maximum value of the voltage applied across the first pixel electrode 5a as well as the second pixel electrode 5b and the common electrode 6. In addition, the auxiliary voltage is preferably such a voltage that the potential difference between this voltage and the common electrode 6 is equal to or more than a voltage value that aligns the liquid crystal molecules 2a to stand at a maximum tilt angle.

In this case, the auxiliary voltage is not exclusively the direct-current voltage. For example, the auxiliary voltage may be a rectangular-wave alternating voltage the level of which is inverted at the same periods as the common signal Vcom applied to the common electrode 6 (the same voltage as the first voltage V1 applied to the first and second capacitive electrodes 17 and 18a) and the amplitude of which is higher than the amplitude of the first voltage V1.

Furthermore, in the embodiments described above, the first, second and third capacitive electrodes 17, 18a, and 18b and the auxiliary electrode 19 are formed on the same surface (on the first substrate 3 or en the first coating insulating film 20a). However, the capacitive electrodes 17, 18a, and 18b and the auxiliary electrode 19 may be formed on different surfaces. That is, for example, in the third and fourth embodiments, the capacitive electrodes 17, 18a, and 18b may be formed on the first substrate 3, and the auxiliary electrode 19 may be formed on the first coating insulating film 20a. Alternatively, the auxiliary electrode 19 may be formed on the first substrate 3, and the first, second and third capacitive electrodes 17, 18a, and 18b may be formed on the first coating insulating film 20a.

Still further, the liquid crystal display device 1 is not exclusively the TN liquid crystal display device, and may be, for example, an STN liquid crystal display device in which liquid crystal molecules are aligned at a twist angle ranging between 180° and 270°, or a nontwist homogeneous alignment type liquid crystal display device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A liquid crystal display apparatus comprising:
an auxiliary electrode located between a first scan signal line and a second scan signal line that are adjacent to each other;

a first thin film transistor with a gate electrode connected to the first scan signal line;
a second thin film transistor with a gate electrode connected to the second scan signal line;
a first pixel electrode connected to one of a source electrode and a drain electrode of the first thin film transistor;
a second pixel electrode connected to one of a source electrode and a drain electrode of the second thin film transistor;
a data signal line that is connected to the other of the source electrode and the drain electrode of the first thin film transistor and that is connected to the other of the source electrode and the drain electrode of the second thin film transistor; and
a common electrode disposed to face the first pixel electrode and the second pixel electrode through a liquid crystal layer,
wherein the first pixel electrode and the second pixel electrode are adjacently located along the data signal line, and
wherein the auxiliary electrode is set to a direct-current voltage so that a potential difference between the auxiliary electrode and the common electrode is greater than a potential difference between the first pixel electrode and the common electrode and greater than a potential difference between the second pixel electrode and the common electrode.

2. The liquid crystal display apparatus according to claim 1, further comprising:
a first capacitive electrode disposed to overlap the first pixel electrode;
a second capacitive electrode disposed to overlap the second pixel electrode; and
a third capacitive electrode disposed to overlap the second pixel electrode at a different position from the second capacitive electrode,
the first capacitive electrode and the second capacitive electrode being set at a voltage equal to that of the common electrode, and
the third capacitive electrode being set at a voltage different from that of the common electrode.

3. The liquid crystal display apparatus according to claim 1, wherein a pixel corresponding to the first pixel electrode comprises a third pixel electrode that is disposed so that the first scan signal line intervenes between the third pixel electrode and the first pixel electrode, and
wherein a pixel corresponding to the second pixel electrode comprises a fourth pixel electrode that is disposed so that the second scan signal line intervenes between the fourth pixel electrode and the second pixel electrode.

4. The liquid crystal display apparatus according to claim 1, further comprising an alignment film located over the first pixel electrode and the second pixel electrode,
the alignment film being subjected to an aligning treatment to pretilt liquid crystal molecules in the liquid crystal layer.

5. A liquid crystal display apparatus comprising:
an auxiliary electrode located between a first scan signal line and a second scan signal line that are adjacent to each other;
a first thin film transistor with a gate electrode connected to the first scan signal line;
a second thin film transistor with a gate electrode connected to the second scan signal line;
a first pixel electrode connected to one of a source electrode and a drain electrode of the first thin film transistor;
a second pixel electrode connected to one of a source electrode and a drain electrode of the second thin film transistor; and
a data signal line that is connected to the other of the source electrode and the drain electrode of the first thin film transistor and that is connected to the other of the source electrode and the drain electrode of the second thin film transistor,
wherein the first pixel electrode and the second pixel electrode are adjacently located along the data signal line, and
wherein the auxiliary electrode is located between the first pixel electrode and the second pixel electrode, and is set to a direct-current voltage of a value equal to a gate on voltage or a gate off voltage supplied to the first scan signal line.

6. The liquid crystal display apparatus according to claim 5, further comprising a common electrode disposed to face the first pixel electrode and the second pixel electrode through a liquid crystal layer.

7. The liquid crystal display apparatus according to claim 6, further comprising:
a first capacitive electrode disposed to overlap the first pixel electrode;
a second capacitive electrode disposed to overlap the second pixel electrode; and
a third capacitive electrode disposed to overlap the first pixel electrode at a different position from the first capacitive electrode,
the first capacitive electrode and the second capacitive electrode being set at a voltage equal to that of the common electrode, and
the third capacitive electrode being set at a voltage different from that of the common electrode.

8. The liquid crystal display apparatus according to claim 7, wherein a pixel corresponding to the first pixel electrode comprises a third pixel electrode which is disposed so that the first scan signal line intervenes between the third pixel electrode and the first pixel electrode, and
wherein a pixel corresponding to the second pixel electrode comprises a fourth pixel electrode which is disposed so that the second scan signal line intervenes between the fourth pixel electrode and the second pixel electrode.

9. The liquid crystal display apparatus according to claim 7, wherein the first scan signal line and the second scan signal line extend in parallel to each other, and the auxiliary electrode extends in parallel to the first scan signal line and the second scan signal line.

10. The liquid crystal display apparatus according to claim 5, wherein the auxiliary electrode is made of a conducting material having light shielding properties.

11. The liquid crystal display apparatus according to claim 5, wherein the first pixel electrode and the second pixel electrode are located so as not to overlap the auxiliary electrode.

12. The liquid crystal display apparatus according to claim 6, further comprising an alignment film located over the first pixel electrode and the second pixel electrode, wherein the alignment film is subjected to an aligning treatment to pretilt liquid crystal molecules in the liquid crystal layer.

13. A liquid crystal display apparatus comprising:
a first pixel and a second pixel adjacently located along a data signal line; and
an auxiliary electrode located between the first pixel and the second pixel,
wherein the first pixel comprises two pixel electrodes connected to a first scan signal line through different thin film transistors, the two pixel electrodes in the first pixel being disposed so that the first scan signal line intervenes therebetween, wherein the second pixel comprises two pixel electrodes connected to a second scan signal line through different thin film transistors, the two pixel electrodes in the second pixel being disposed so that the second scan signal line intervenes therebetween, and wherein the auxiliary electrode is provided to extend in parallel to the first scan signal line and the second scan signal line, the auxiliary electrode being set to a direct-current voltage of a value equal to a gate on voltage or a gate off voltage supplied to the first scan signal line.

14. The liquid crystal display apparatus according to claim 13, wherein the two pixel electrodes in the first pixel are connected to the data signal line through said different thin film transistors in the first pixel, and the two pixel electrodes in the second pixel are connected to the data signal line through said different thin film transistors in the second pixel.

15. The liquid crystal display apparatus according to claim 13, wherein the data signal line extends in a direction perpendicular to an extending direction of the auxiliary electrode.

16. The liquid crystal display apparatus according to claim 13, further comprising a common electrode disposed to face the two pixel electrodes in the first pixel and the two pixel electrodes in the second pixel through a liquid crystal layer.

17. The liquid crystal display apparatus according to claim 16, further comprising:

a first step-down capacitive electrode that is disposed to only overlap one of the two pixel electrodes in the first pixel and that is set to a voltage different from that of the common electrode; and a second step-down capacitive electrode that is disposed to only overlap one of the two pixel electrodes in the second pixel and that is set to a voltage equal to that of the first step-down capacitive electrode.

18. The liquid crystal display apparatus according to claim 16, further comprising an alignment film located over the two pixel electrodes in the first pixel and the two pixel electrodes in the second pixel, wherein the alignment film is subjected to an aligning treatment to pretilt liquid crystal molecules in the liquid crystal layer.

19. A liquid crystal display apparatus comprising:

a first pixel and a second pixel adjacently located along a data signal line; and an auxiliary electrode located between the first pixel and the second pixel, wherein the first pixel comprises two pixel electrodes connected to a first scan signal line through different thin film transistors, the two pixel electrodes in the first pixel being disposed so that the first scan signal line intervenes therebetween, wherein the second pixel comprises two pixel electrodes connected to a second scan signal line through different thin film transistors, the two pixel electrodes in the second pixel being disposed so that the second scan signal line intervenes therebetween, and wherein the auxiliary electrode is provided to extend in parallel to the first scan signal line and the second scan signal line, the auxiliary electrode being set to a direct-current voltage so that a potential difference between the auxiliary electrode and a common electrode is greater than a potential difference between the two pixel electrodes in the first pixel and the common electrode and greater than a potential difference between the two pixel electrodes in the second pixel and the common electrode.

20. The liquid crystal display apparatus according to claim 19, wherein the common electrode is disposed to face the two pixel electrodes in the first pixel and the two pixel electrodes in the second pixel through a liquid crystal layer.

* * * * *